US011508688B2

(12) United States Patent
Seyama et al.

(10) Patent No.: US 11,508,688 B2
(45) Date of Patent: Nov. 22, 2022

(54) BONDING APPARATUS INCLUDING A HEATER AND A COOLING FLOW PATH USED FOR STACKING A PLURALITY OF SEMICONDUCTOR CHIPS

(71) Applicant: SHINKAWA LTD., Tokyo (JP)

(72) Inventors: Kohei Seyama, Tokyo (JP); Yuji Eguchi, Tokyo (JP); Shoji Wada, Tokyo (JP)

(73) Assignee: SHINKAWA LTD., Tokyo (JP)

( * ) Notice: Subject to any disclaimer, the term of this patent is extended or adjusted under 35 U.S.C. 154(b) by 922 days.

(21) Appl. No.: 16/087,087

(22) PCT Filed: Mar. 24, 2017

(86) PCT No.: PCT/JP2017/012077
§ 371 (c)(1),
(2) Date: Dec. 9, 2018

(87) PCT Pub. No.: WO2017/164385
PCT Pub. Date: Sep. 28, 2017

(65) Prior Publication Data
US 2021/0225799 A1      Jul. 22, 2021

(30) Foreign Application Priority Data

Mar. 24, 2016    (JP) .............................. JP2016-059364

(51) Int. Cl.
*H01L 23/00*      (2006.01)
*H01L 21/52*      (2006.01)
(Continued)

(52) U.S. Cl.
CPC .............. *H01L 24/75* (2013.01); *H01L 21/52* (2013.01); *H01L 24/32* (2013.01); *H01L 24/73* (2013.01);
(Continued)

(58) Field of Classification Search
CPC ... H01L 24/73; H01L 25/0657; H01L 25/105; H01L 24/32; H01L 21/52;
(Continued)

(56) References Cited

U.S. PATENT DOCUMENTS 6,347,734 B1 * 2/2002 Downes ............... B23K 1/0016
                                                228/180.21
2004/0217470 A1 * 11/2004 Takano ................... H01L 24/29
                                                257/734
(Continued)

FOREIGN PATENT DOCUMENTS

JP    H10335392    12/1998
JP    H1154559     2/1999
(Continued)

OTHER PUBLICATIONS

"International Search Report (Form PCT/ISA/210)" of PCT/JP2017/012077, dated Apr. 25, 2017, with English translation thereof, pp. 1-4.

*Primary Examiner* — Marcos D. Pizarro
(74) *Attorney, Agent, or Firm* — JCIPRNET

(57) ABSTRACT

The present invention has: a heater; and a bonding tool having a lower surface on which a memory chip is adsorbed; and an upper surface attached to the heater, and is provided with a bonding tool which presses the peripheral edge of the memory chip to a solder ball in a first peripheral area of the lower surface and which presses the center of the memory chip (60) to a DAF having a heat resistance temperature lower than that of the solder ball in a first center area. The amount of heat transmitted from the first center area to the center of the memory chip is smaller than that transmitted from the first peripheral area (A) to the peripheral edge of the memory chip. Thus, the bonding apparatus in which the
(Continued)

center of a bonding member can be heated to a temperature lower than that at the peripheral edge can be provided.

15 Claims, 17 Drawing Sheets

(51) Int. Cl.
*H01L 25/065* (2006.01)
*H01L 25/10* (2006.01)

(52) U.S. Cl.
CPC ........ *H01L 25/0657* (2013.01); *H01L 25/105* (2013.01); *H01L 2224/32145* (2013.01); *H01L 2224/32225* (2013.01); *H01L 2224/73253* (2013.01); *H01L 2224/75252* (2013.01); *H01L 2224/75502* (2013.01)

(58) Field of Classification Search
CPC . H01L 2224/32225; H01L 2224/73253; H01L 2224/32145; H01L 21/67; H01L 24/75; H01L 25/50; H01L 2224/75252; H01L 2224/75502
See application file for complete search history.

(56) References Cited

U.S. PATENT DOCUMENTS

| | | |
|---|---|---|
| 2005/0073017 A1 | 4/2005 | Kim |
| 2005/0208702 A1 | 9/2005 | Kim |
| 2009/0020885 A1 | 1/2009 | Onodera |

FOREIGN PATENT DOCUMENTS

| | | |
|---|---|---|
| JP | 2007523473 | 8/2007 |
| JP | 2008166527 | 7/2008 |
| JP | 2009026985 | 2/2009 |
| JP | 2012146947 | 8/2012 |
| JP | 2012199358 | 10/2012 |
| JP | 2013098264 | 5/2013 |
| JP | 2015176906 | 10/2015 |

\* cited by examiner

BONDING APPARATUS INCLUDING A HEATER AND A COOLING FLOW PATH USED FOR STACKING A PLURALITY OF SEMICONDUCTOR CHIPS

CROSS-REFERENCE TO RELATED APPLICATION

This application is a 371 application of the international PCT application serial no. PCT/JP2017/012077, filed on Mar. 24, 2017, which claims the priority benefit of Japan application no. 2016-059364, filed on Mar. 24, 2016. The entirety of each of the above-mentioned patent applications is hereby incorporated by reference herein and made a part of this specification.

TECHNICAL FIELD

The present invention relates to a bonding apparatus, and particularly, to a structure of a bonding tool and a stage used in a bonding apparatus.

BACKGROUND ART

In recent years, in order to respond to the demand for a small size and the advancement of semiconductor devices, a three-dimensional mounting structure in which a plurality of semiconductor chips are stacked has been used. As a three-dimensional mounting structure, for example, a structure in which two spacers are formed on a substrate, a controller chip is attached between two spacers, a first stage memory chip is attached onto the two spacers so that it crosses a controller chip with an adhesive layer of a die attach film (hereinafter referred to as a DAF) therebetween, and a plurality of memory chips are stacked on the first stage memory chip with the adhesive layer therebetween has been proposed (for example, refer to Patent Literature 1). A DAF is a thermosetting resin film.

In addition, a three-dimensional mounting structure in which a plurality of semiconductor chips are stacked on an upper surface of a second substrate having an opening at its center with a DAF therebetween, and which constitutes an upper semiconductor module in which a solder ball is formed on a lower surface of a substrate and a lower semiconductor module in which a semiconductor chip with a smaller size than an opening is stacked on a first substrate at a position corresponding to an opening of the second substrate constituting the upper semiconductor module, and in which an adhesive is applied to an upper surface of the semiconductor chip stacked on the lower semiconductor module, the upper semiconductor module is aligned with the lower semiconductor module and reflowed, and thus the solder ball is melted and the adhesive is cured, and the upper semiconductor module and the lower semiconductor module are bonded has been proposed (for example, refer to Patent Literature 2).

In contrast, as a method of bonding a semiconductor chip and a substrate or semiconductor chips to each other, a flip chip bonding method in which a solder bump or a gold bump is formed on the semiconductor chip, a film-like insulating resin is attached to a surface of the semiconductor chip on which the bump is formed, the semiconductor chip is then inverted, the semiconductor chip is thermocompression-bonded onto the substrate by a bonding tool, the solder bump or the gold bump melts, the substrate and the semiconductor chip are bonded to each other, and a sealing resin between the semiconductor chip and the substrate can be cured is widely used. In the flip chip bonding method, when there is a variation in a melting state of the solder bump or the gold bump in the semiconductor chip, the solder bump or the gold bump of a part with a low temperature may be un-melted and a bonding defect may be caused. Therefore, a collet (bonding tool) in which a contact density with respect to the semiconductor chip is distributed densely, so that the semiconductor chip can be uniformly heated has been proposed (for example, refer to Patent Literature 3).

CITATION LIST

Patent Literature

[Patent Literature 1]
  Japanese Unexamined Patent Application Publication No. 2015-176906
[Patent Literature 2]
  Japanese Unexamined Patent Application Publication No. 2008-166527
[Patent Literature 3]
  Japanese Unexamined Patent Application Publication No. 2012-199358

SUMMARY OF INVENTION

Technical Problem

Incidentally, for a method of producing a semiconductor device having a three-dimensional structure more efficiently as described in Patent Literature 1, a bonding method in which a central portion of a memory chip is adhered to an upper surface of a control chip using a thermosetting resin film such as a DAF, and a peripheral edge portion of the memory chip is connected to the substrate using a connection metal that is used to connect metal members by curing after thermal melting of a solder ball or the like is being studied. This bonding method is an application of a flip chip bonding method described in Patent Literature 3, a memory chip heated with a heater is pressed onto a control chip, the DAF is thermally cured, a central portion of the memory chip is adhered and fixed to the control chip, and at the same time, a peripheral edge portion of the memory chip is pressed onto the bonding metal, the bonding metal melts, and the memory chip and the substrate are electrically connected.

However, since a heat resistance temperature of the DAF is lower than a melting temperature of the bonding metal such as a solder ball, when the memory chip is heated to the melting temperature of the bonding metal, there is a problem of the DAF deteriorating. In contrast, when the memory chip is heated only to the heat resistance temperature of the DAF, there is a problem that the bonding metal does not sufficiently melt and an electrical connection between the memory chip and the substrate is not favorable. Therefore, such a bonding method cannot be used in the bonding apparatus that uniformly heats the semiconductor chip as described in Patent Literature 3, and a bonding apparatus that can heat a memory chip (bonding member) so that a temperature of the central portion of the memory chip (bonding member) is lower than a temperature of the peripheral edge portion is desirable.

Thus, an objective of the present invention is to provide a bonding apparatus that can heat a center of a bonding member to a temperature lower than that of a peripheral edge.

Solution to Problem

A bonding apparatus of the present invention includes a heater; and a bonding tool which includes a first surface that absorbs a bonding member and a second surface that is attached to the heater on the side opposite to the first surface and in which a first peripheral area of the first surface presses a peripheral edge of the bonding member to a first member and a first central area of the first surface presses the center of the bonding member to a second member having a lower heat resistance temperature than the first member, wherein an amount of heat per unit area of the bonding member that is transmitted from the first central area of the bonding tool to the center of the bonding member is smaller than an amount of heat per unit area of the bonding member that is transmitted from the first peripheral area of the bonding tool to a peripheral edge of the bonding member, and the first central area of the bonding tool has a cooling flow path through which cooling air flows.

In the bonding apparatus of the present invention, preferably, the first central area of the bonding tool has a smaller area in contact with the bonding member than the first peripheral area of the bonding tool.

In the bonding apparatus of the present invention, preferably, the first central area of the bonding tool is made of a material having a lower thermal conductivity than that of the first peripheral area of the bonding tool.

In the bonding apparatus of the present invention, preferably, the second surface of the bonding tool includes a second central area corresponding to the first central area and a second peripheral area outside the periphery of the second central area, and an amount of heat per unit area of the heater that is transmitted from the center of the heater to the second central area of the bonding tool is smaller than an amount of heat per unit area of the heater that is transmitted from a peripheral edge of the heater to the second peripheral area of the bonding tool.

In the bonding apparatus of the present invention, preferably, the second central area of the bonding tool has a smaller area in contact with the heater than the second peripheral area of the bonding tool.

In the bonding apparatus of the present invention, preferably, a plurality of recesses are disposed in a lattice form on the second central area of the bonding tool.

In the bonding apparatus of the present invention, preferably, the second central area of the bonding tool includes a cooling flow path through which cooling air flows.

In the bonding apparatus of the present invention, preferably, the second central area of the bonding tool is made of a material having a lower thermal conductivity than that of the second peripheral area of the bonding tool.

Preferably, the bonding apparatus of the present invention includes a stage that absorbs and fixes a substrate, and the second member is placed on an electronic component bonded to the substrate, the first member is formed on the substrate around the electronic component, and an amount of heat per unit area of the substrate that is transmitted to a first portion of the stage that faces a first area of the substrate from the first area of the substrate to which the electronic component is bonded is larger than an amount of heat per unit area of the substrate that is transmitted to a second portion of the stage that faces a second area of the substrate from the second area of the substrate in which the first member is disposed.

In the bonding apparatus of the present invention, preferably, in the stage, a cooling flow path through which cooling air flows is provided in the first portion, and preferably, a recess is provided on a surface of the second portion.

A bonding apparatus of the present invention includes a heater; and a bonding tool, wherein the bonding tool includes a first surface that absorbs a bonding member and a second surface that is attached to the heater on the side opposite to the first surface, the first surface includes a first peripheral area and a first central area, a recess is formed in the first central area, the first peripheral area of the first surface presses a peripheral edge of the bonding member to a first member, and the first central area of the first surface presses a center of the bonding member to a second member having a lower heat resistance temperature than the first member, wherein the bonding tool further includes a vacuum hole that communicates with the recess from the second surface to absorb the bonding member and forms a vacuum heat insulating layer between the recess and the bonding member, wherein an amount of heat per unit area of the bonding member that is transmitted from the first central area of the bonding tool to the center of the bonding member is smaller than an amount of heat per unit area of the bonding member that is transmitted from the first peripheral area of the bonding tool to the peripheral edge of the bonding member, and wherein the first central area of the bonding tool has a cooling flow path through which cooling air flows. Further, in the bonding apparatus of the present invention, a plurality of recesses may be disposed in a lattice form on the first central area of the bonding tool. Further, in the bonding apparatus of the present invention, the second surface of the bonding tool may include a second central area corresponding to the first central area and a second peripheral area outside the periphery of the second central area, an amount of heat per unit area of the heater that is transmitted from the center of the heater to the second central area of the bonding tool may be smaller than an amount of heat per unit area of the heater that is transmitted from a peripheral edge of the heater to the second peripheral area of the bonding tool, and the second central area of the bonding tool may have a smaller area in contact with the heater than the second peripheral area of the bonding tool. Further, in the bonding apparatus of the present invention, a plurality of recesses may be disposed in a lattice form on the second central area of the bonding tool, the second central area of the bonding tool may include a cooling flow path through which cooling air flows, and the second central area of the bonding tool may be made of a material having a lower thermal conductivity than that of the second peripheral area of the bonding tool. Further, the bonding apparatus of the present invention may include a stage that absorbs and fixes a substrate, wherein the second member is placed on an electronic component bonded to the substrate, the first member is formed on the substrate around the electronic component, and an amount of heat per unit area of the substrate that is transmitted to a first portion of the stage that faces a first area of the substrate from the first area of the substrate to which the electronic component is bonded is larger than an amount of heat per unit area of the substrate that is transmitted to a second portion of the stage that faces a second area of the substrate from the second area of the substrate in which the first member is disposed. Further, in the bonding apparatus of the present invention, in the stage, a cooling flow path through which cooling air flows may be provided in the first portion, and in the stage, a recess may be provided on a surface of the second portion.

Advantageous Effects of Invention

The present invention can provide a bonding apparatus that can heat a center of a bonding member to a temperature lower than that of a peripheral edge.

DESCRIPTION OF EMBODIMENTS

First Embodiment

Figure 1:
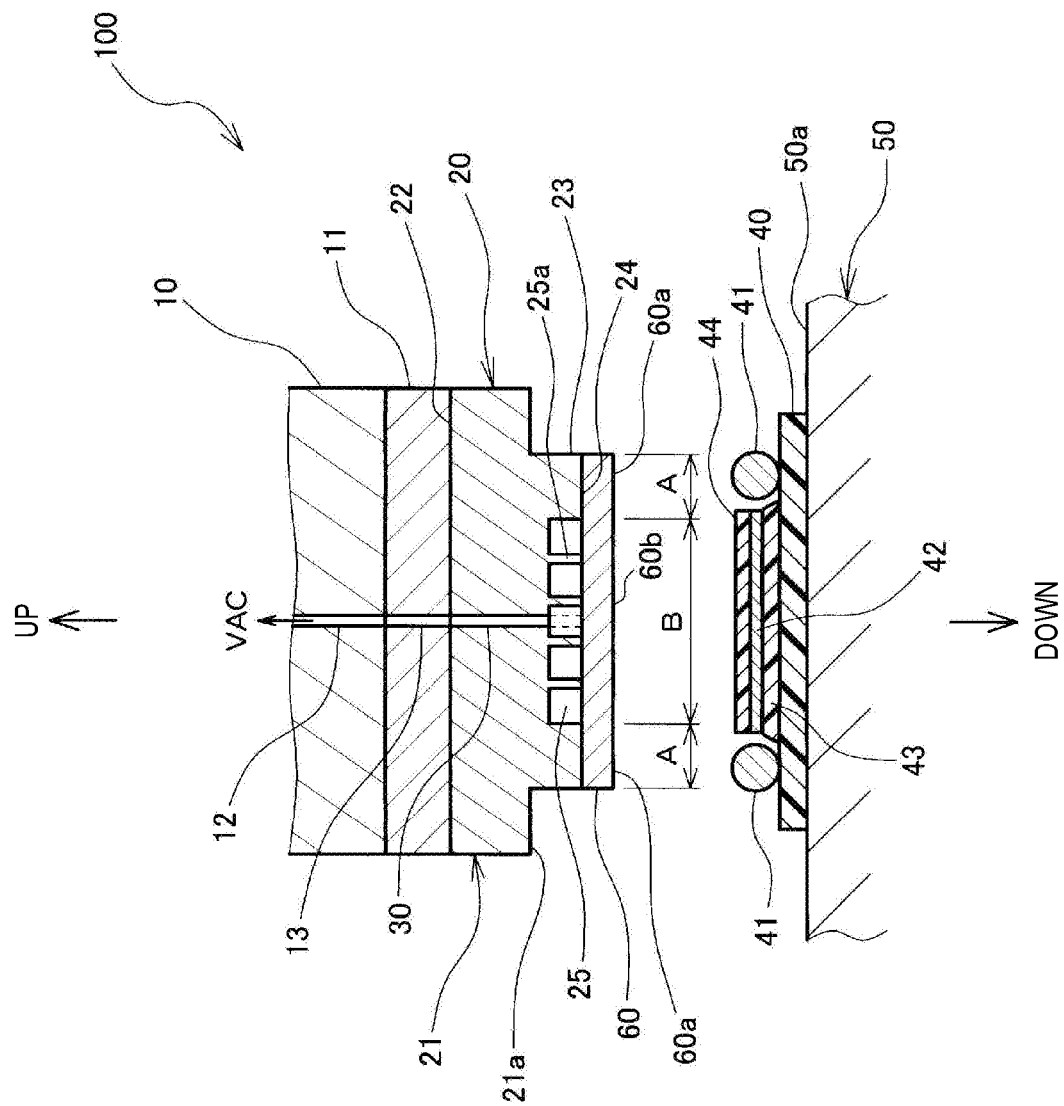
FIG. 1 is a cross-sectional view of a bonding apparatus of a first embodiment of the present invention.

A first embodiment of the present invention will be described below with reference to the drawings. As shown in FIG. 1, a bonding apparatus 100 of the present embodiment includes a stage 50 for vacuum suctioning a substrate 40, a bonding head 10 which is disposed on the stage 50 and is driven in a vertical direction by a driving device (not shown), a heater 11 that is attached to a lower surface of the bonding head 10, and a bonding tool 20 that is attached to a lower surface of the heater 11. Here, the terms up and down shown in FIG. 1 indicate vertically upward and vertically downward. This similarly applies to other drawings.

Figure 2:
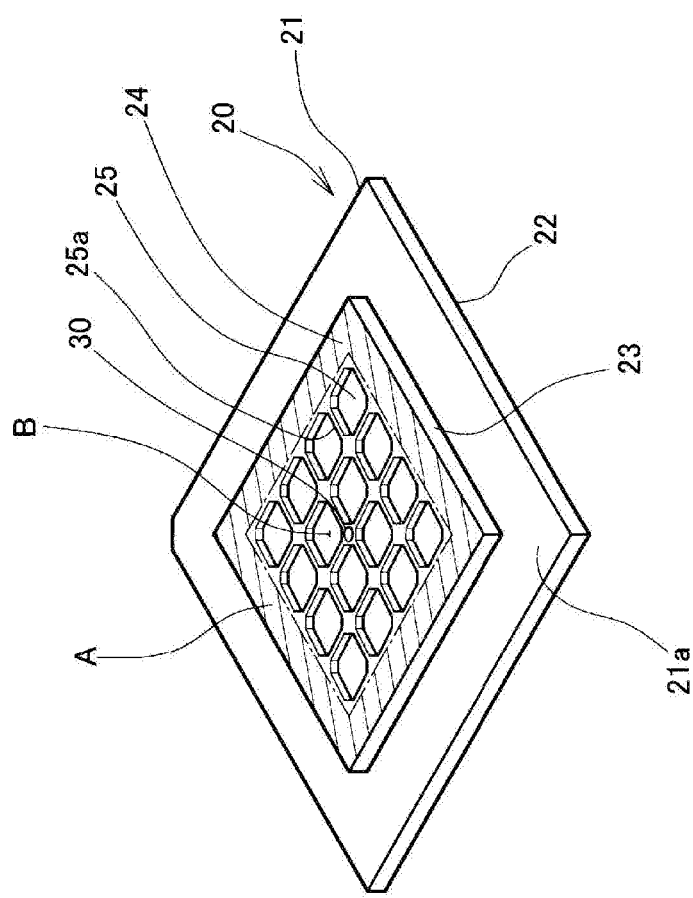
FIG. 2 is a perspective view of a bonding tool attached to the bonding apparatus shown in FIG. 1 when viewed from the lower side.

As shown in FIGS. 1 and 2, the bonding tool 20 includes a rectangular plate-like base 21, and an island 23 that protrudes in a rectangular pedestal shape from a lower surface 21a of the base 21. A lower surface 24 of the island 23 which is a first surface of the bonding tool 20 vacuum-suctions a memory chip 60 which is a bonding member. FIG. 1 shows a state in which the memory chip 60 is vacuum-suctioned to the lower surface 24 of the bonding tool 20. The island 23 has a smaller size than the base 21, and has substantially the same rectangular shape as the memory chip 60 that is vacuum-suctioned to the lower surface 24.

As shown in FIG. 2, a plurality of recesses 25 surrounded with ribs 25a with a narrow width are disposed in a lattice form at the center of the lower surface 24 of the bonding tool 20. A tip surface of the rib 25a is flush with the lower surface 24 such that it is in contact with an upper surface of the memory chip 60. A vacuum hole 30 is provided on the tip surface of the rib 25a at the center of the bonding tool 20.

An area in which the plurality of recesses 25 of the lower surface 24 are disposed is the first central area B of the bonding tool 20, and a hatched area outside the periphery of the first central area B of the lower surface 24 in FIG. 2 is a first peripheral area A of the bonding tool 20. In addition, an area of the memory chip 60 that faces the first central area B of the bonding tool 20 is a center 60b (a center of a bonding member) of the memory chip 60, and an area of the memory chip 60 that faces the first peripheral area A of the bonding tool 20 is a peripheral edge 60a (a peripheral edge of a bonding member) of the memory chip 60.

A vacuum hole (not shown) is provided in the bonding head 10 and the heater 11, and the bonding tool 20 is fixed to the lower surface of the heater 11 by vacuum suction. Thus, the heater 11 can be easily replaced. In the present embodiment, the bonding tool 20 including the first central area B having the same size as a control chip 42 mounted on the substrate 40 to be described below, and the first peripheral area A that covers an area of a solder ball 41 formed on the substrate 40 to be described below is attached.

In the heater 11, for example, in the interior of a ceramic such as aluminum nitride, a heating resistor made of platinum or tungsten is embedded. As shown in FIG. 1, the heater 11 has a rectangular plate shape and has substantially the same size as the base 21 of the bonding tool 20. A vacuum hole 13 that communicates with the vacuum hole 30 of the bonding tool 20 is provided at the center of the heater 11. As shown in FIG. 1, at the bonding head 10, a vacuum hole 12 that communicates with the vacuum hole 13 of the heater 11 and the vacuum hole 30 of the bonding tool 20 is provided. The communicating vacuum holes 12, 13, and 30 are connected to a vacuum device VAC (not shown) and the memory chip 60 is vacuum-suctioned to the lower surface 24 of the bonding tool 20.

As shown in FIG. 1, the stage 50 vacuum-suctions the substrate 40 to a surface 50a. The bonding head 10 is movable in the horizontal direction. FIG. 1 shows a state in which a center position of the bonding head 10 in the horizontal direction is aligned with a center position of the control chip 42.

The control chip 42 is bonded to the center of the substrate 40 shown in FIG. 1 and a gap between the control chip 42 and the substrate 40 is sealed with a resin 43. A DAF 44 which is a second member is placed on an upper surface of the control chip 42. The plurality of solder balls 41 which are first members are formed around the control chip 42 on the upper surface of the substrate 40. The control chip 42 has a smaller size than the memory chip 60 or the island 23 of the bonding tool 20, and has substantially the same size as the first central area B of the bonding tool 20 or the center 60b of the memory chip 60. In addition, as shown in FIG. 1, when a center position of the bonding head 10 in the horizontal direction is aligned with a center position of the control chip 42, the solder ball 41 is positioned in an area that faces the first peripheral area A of the bonding tool 20 or the peripheral edge 60a of the memory chip 60.

Figure 3:
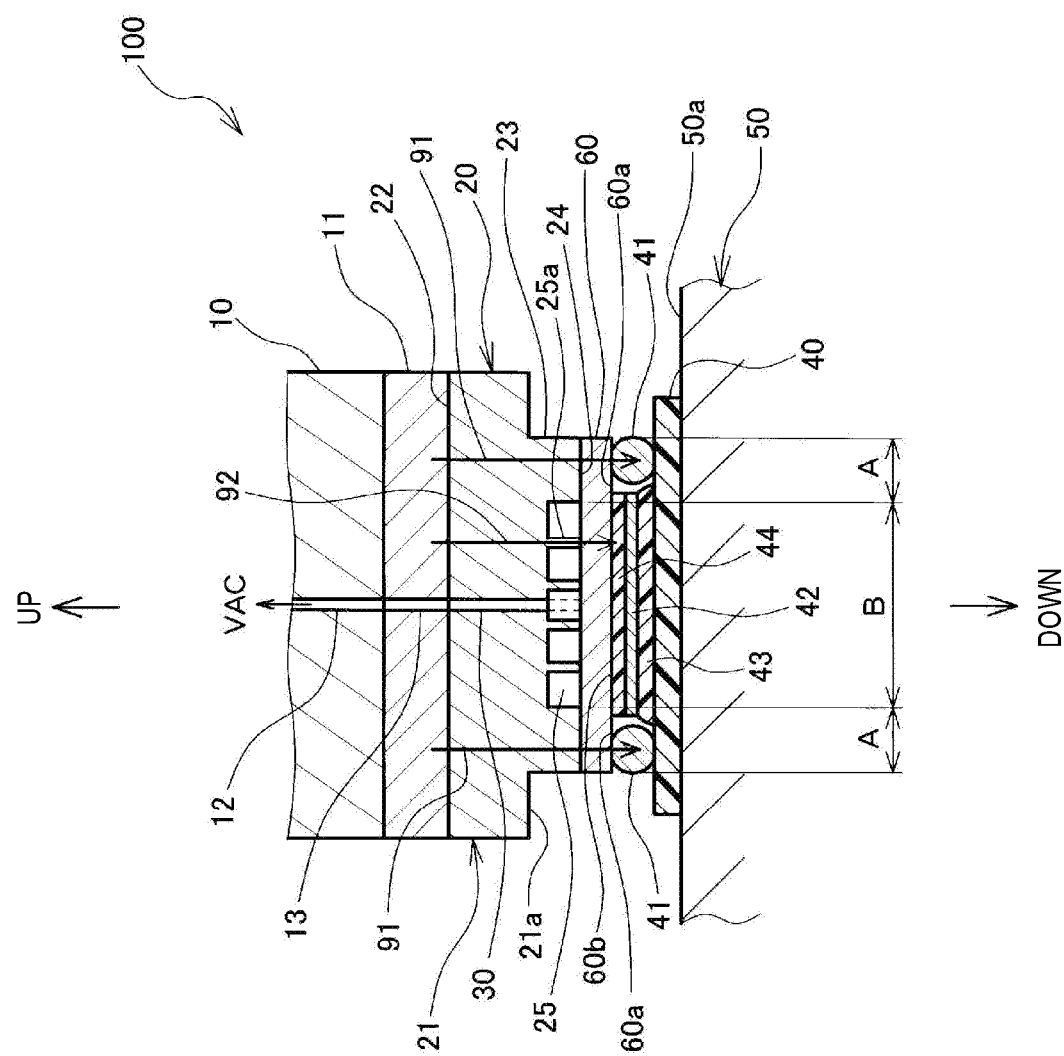
FIG. 3 is an explanatory diagram showing a state in which the bonding apparatus shown in FIG. 1 presses a center of a memory chip heated with a heater to a DAF on a controller chip and presses a peripheral edge of the memory chip onto a solder ball formed on a substrate.

As shown in FIG. 3, when a control unit (not shown) of the bonding apparatus 100 lowers the bonding head 10 toward the stage 50 in the state shown in FIG. 1, a lower surface of the center 60b of the memory chip 60 presses the DAF 44 placed on the control chip 42 downward by a downward load that is transmitted through the rib 25a of the bonding tool 20. The lower surface of the peripheral edge 60a of the memory chip 60 presses the solder ball 41 downward by a downward load that is transmitted through the first peripheral area A of the bonding tool 20. In addition, when the heater 11 is turned on, as indicated by an arrow 91, heat of the heater 11 heats the peripheral edge 60a of the memory chip 60 through the first peripheral area A of the bonding tool 20, and the peripheral edge 60a of the memory chip 60 heats the solder ball 41. In addition, as indicated by an arrow 92, heat of the heater 11 heats the center 60b of the memory chip 60 through the first central area B of the bonding tool 20, and the center 60b of the memory chip 60 heats the DAF 44 placed on the control chip 42.

As shown in FIG. 2, in the first central area B of the lower surface 24 of the bonding tool 20, the plurality of recesses 25 are arranged in a lattice form. When the memory chip 60 is vacuum-suctioned to the lower surface 24 of the bonding tool 20, air in the recess 25 is sucked out from the vacuum hole 30 into a vacuum device VAC, and the recess 25 forms a vacuum heat insulating layer. Therefore, heat from the heater 11 does not reach the memory chip 60 through the recess 25, and as indicated by the arrow 92 in FIG. 3, it reaches the memory chip 60 through the tip surface of the rib 25a in contact with the upper surface of the memory chip 60. In contrast, the first peripheral area A of the bonding tool 20 is a plane and is in contact with the upper surface of the memory chip 60. Therefore, as indicated by the arrow 91 in FIG. 3, heat from the heater 11 reaches the memory chip 60 from the entire first peripheral area A of the bonding tool 20.

Here, a contact area between the tip surface of the rib 25a of the bonding tool 20 and the center 60b of the memory chip 60 is smaller than a contact area between the first peripheral area A of the bonding tool 20 and the peripheral edge 60a of the memory chip 60. In addition, as described above, the heat insulating layer formed with the recess 25 hardly transmits heat of the heater 11. Therefore, an amount of heat per unit area of the memory chip 60 that is transmitted to the center 60b of the memory chip 60 from the first central area B of the bonding tool 20 is smaller than an amount of heat per unit area of the memory chip 60 that is transmitted from the first peripheral area A of the bonding tool 20 to the peripheral edge 60a of the memory chip 60. Therefore, when the heater 11 uniformly heats an upper surface 22 of the bonding tool 20, a heat input per unit area of the center 60b of the memory chip 60 is smaller than a heat input per unit area of the peripheral edge 60a of the memory chip 60, and a temperature of the center 60b of the memory chip 60 is lower than that of the peripheral edge 60a of the memory chip 60. Therefore, for example, even though a temperature of the peripheral edge 60a of the memory chip 60 in contact with the solder ball 41 is raised with the heater 11 to 230° C. or higher at which a solder ball melts, a temperature of the center 60b of the memory chip 60 in contact with the DAF 44 can be reduced to lower than 200° C. which is a heat resistance temperature of the DAF. The solder ball 41 melts when it is heated to 230° C. or higher with the peripheral edge 60a of the memory chip 60, and thermal curing of the DAF 44 starts at lower than 200° C., for example, about 180° C. Therefore, the bonding apparatus 100 melts the solder ball 41 and thermally cures the DAF 44 with a lower heat resistance temperature than a melting temperature of the solder ball 41 without deterioration, and can mount the memory chip 60 on the substrate 40 and the control chip 42.

A control unit (not shown) of the bonding apparatus 100 presses and heats the solder ball 41 and the DAF 44 for a predetermined time with the memory chip 60 and releases a vacuum of the vacuum holes 12, 13, and 30 (not shown), and then raises the bonding head 10. In this case, the memory chip 60 is fixed to the control chip 42 with the DAF 44 therebetween. Then, when the bonding head is raised and a heat input from the heater 11 disappears, the solder ball 41 is cured and an electrical connection between the memory chip 60 and the substrate 40 is completed.

As described above, in the bonding apparatus 100 of the present embodiment, when the plurality of recesses 25 are disposed in a lattice form on the lower surface 24 of the bonding tool 20 that absorbs the memory chip 60 which is a bonding member, if the heater 11 uniformly heats the bonding tool 20, a heat input per unit area of the center 60b of the memory chip 60 can be made smaller than a heat input per unit area of the peripheral edge 60a of the memory chip 60 and a temperature of the center 60b of the memory chip 60 can be made lower than that of the peripheral edge 60a of the memory chip 60. Therefore, the solder ball 41 melts and the DAF 44 with a lower heat resistance temperature than a melting temperature of the solder ball 41 is thermally cured without deterioration, and thus the memory chip 60 can be mounted on the substrate 40 and the control chip 42.

In addition, since the bonding tool 20 is absorbed and fixed to a lower surface of the heater 11 by a vacuum suction hole (not shown), it can be easily replaced with a bonding tool 20 having the island 23 with a different size according to the size of the memory chip 60 to be bonded. In addition, bonding tools 20 of many types having different areas of the first central area B and the first peripheral area A may be provided according to the size of the control chip 42 mounted on the substrate 40 and a position at which the solder ball 41 is formed, and it is possible to support various substrates 40 by replacing the bonding tool 20 according to the size of the control chip 42 and the position of the solder ball 41. In this manner, in the bonding apparatus 100 of the present embodiment, by simply replacing the bonding tool 20 according to the size of the memory chip 60 which is a bonding member, a position at which the solder ball 41 which is a first member is formed, and the size of the control chip 42 on which the DAF 44 which is a second member is placed, many types of bonding members can be bonded to various substrates using the same heater.

While a case in which the memory chip 60 and the substrate 40 are bonded by the solder ball 41 has been described in the above description, even though a conductive resin member having a higher curing initiation temperature, and heat resistance temperature than a heat resistance temperature of the DAF 44 is used in place of the solder ball 41, both the conductive resin member and the DAF 44 can be likewise thermally cured, and the memory chip 60 can be mounted on the substrate 40 and the control chip 42 without deteriorating the DAF 44 with a lower heat resistance temperature than a curing initiation temperature of the conductive resin member. In addition, while a case in which the bonding member is the memory chip 60 has been described in the present embodiment, the bonding member may be another electronic component, a resin substrate, or the like.

Second Embodiment

Figure 4:
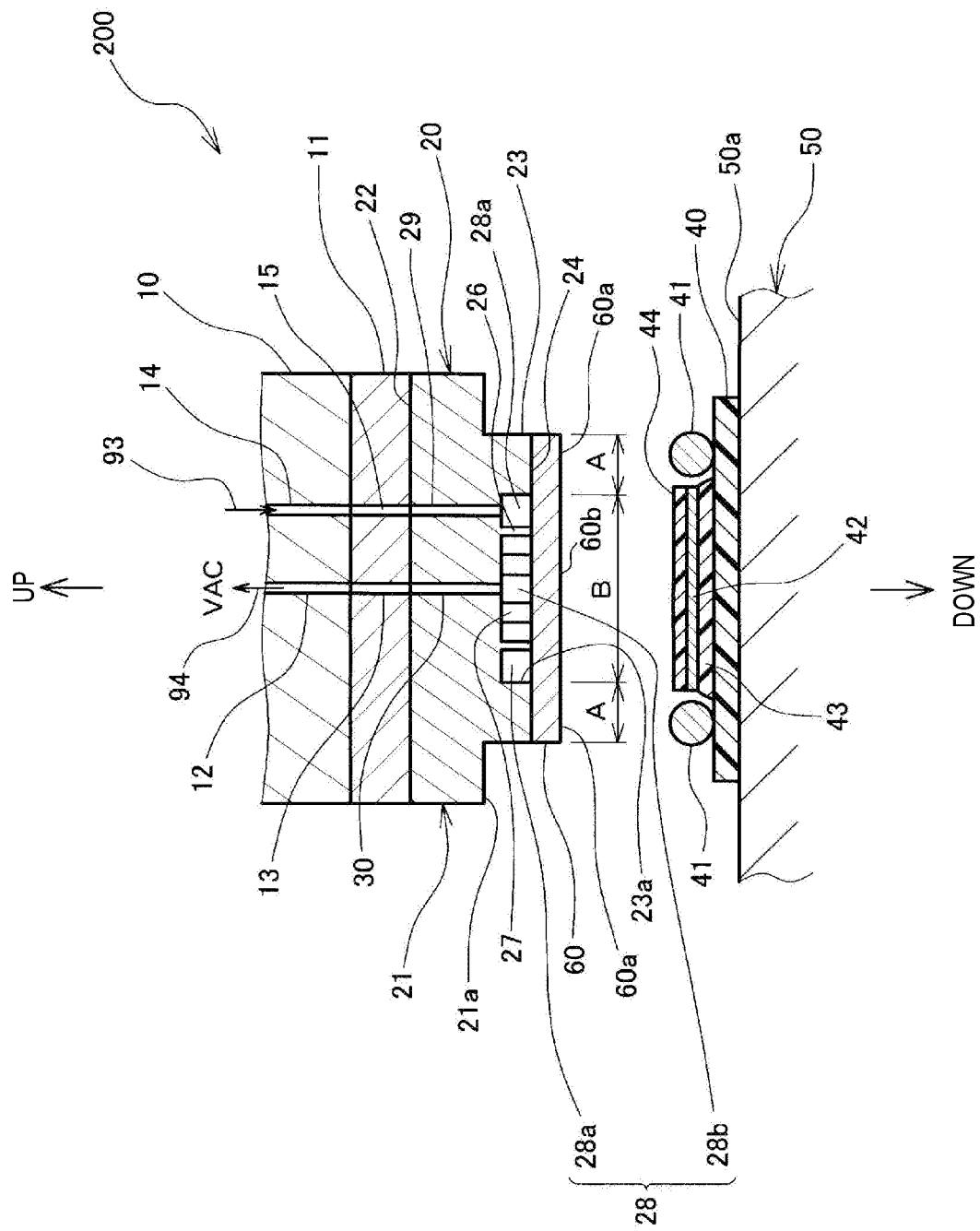
FIG. 4 is a cross-sectional view of a bonding apparatus of a second embodiment of the present invention.
Figure 5:
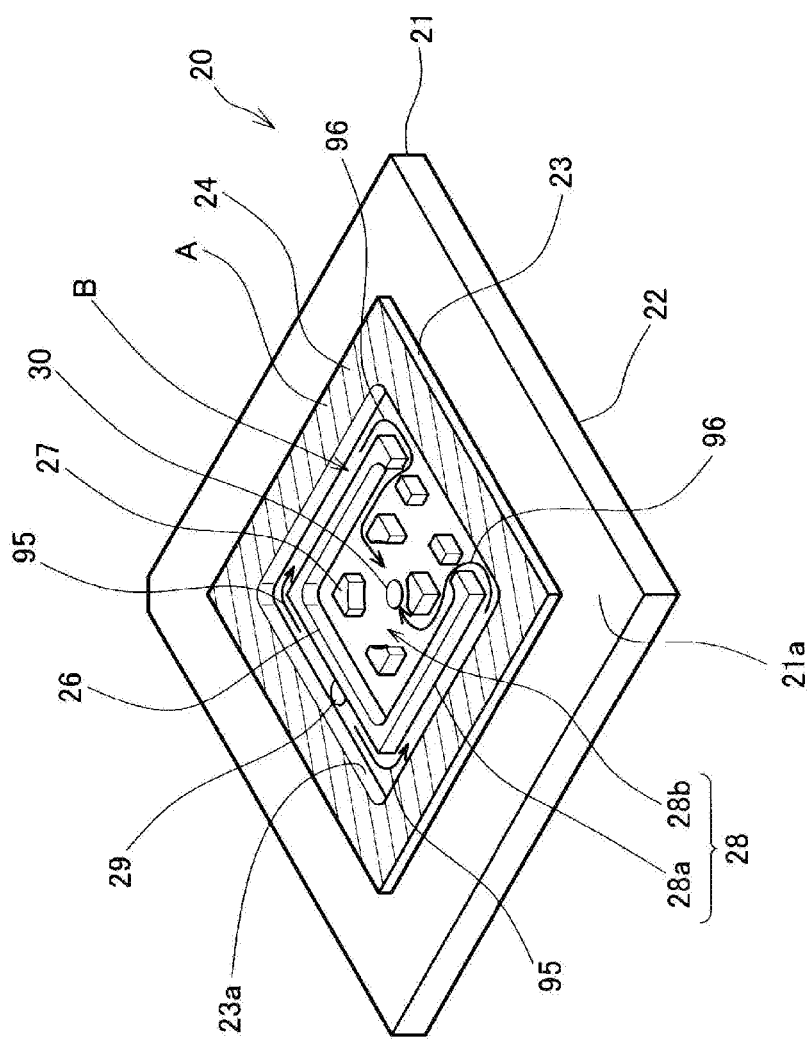
FIG. 5 is a perspective view of a bonding tool attached to the bonding apparatus shown in FIG. 4 when viewed from the lower side.

Next, a bonding apparatus 200 of a second embodiment of the present invention will be described with reference to FIGS. 4 to 6. The bonding apparatus 200 includes a cooling flow path 28 through which cooling air flows as shown in FIGS. 4 and 5 on the lower surface 24 of the bonding tool 20 in place of the recess 25 of the bonding apparatus 100 of the first embodiment. Parts the same as those in the bonding apparatus 100 of the first embodiment described above with reference to FIG. 1 to FIG. 3 are denoted with the same reference numerals, and descriptions thereof will be omitted.

As shown in FIG. 5, on the lower surface 24 of the bonding tool 20, a recess 23a that defines the first central area B is formed. The outer peripheral side of the recess 23a is the first peripheral area A. In FIG. 5, a hatched area is the first peripheral area A. In the recess 23a, a substantially U-shaped partition wall 26, and a plurality of protrusions 27 that are disposed on the inner peripheral side of the partition wall 26 are provided. A surface that faces the inner peripheral surface of the recess 23a of the partition wall 26 forms an outer peripheral cooling flow path 28a through which cooling air flows between it and an inner surface of the recess 23a. The inner peripheral side of the partition wall 26 serves as an inner peripheral cooling flow path 28b through which cooling air flows between the plurality of protrusions 27. A tip surface of the partition wall 26 and a tip surface of the protrusion 27 are flush with the lower surface 24 such that that they are in contact with the upper surface of the memory chip 60. The outer peripheral cooling flow path 28a and the inner peripheral cooling flow path 28b constitute the cooling flow path 28.

As shown in FIGS. 4 and 5, at the center of the bonding tool 20, the vacuum hole 30 penetrating between the inner peripheral cooling flow path 28b and the upper surface 22 is provided. In addition, in the vicinity of the inner peripheral surface of the recess 23a of the bonding tool 20, an air hole 29 that communicates with the outer peripheral cooling flow path 28a and the upper surface 22 is provided. As shown in FIG. 4, the vacuum hole 30 communicates with the vacuum hole 13 provided in the heater 11 and the vacuum hole 12 provided in the bonding head 10 and communicates with a vacuum device VAC. In addition, the air hole 29 communicates with an air hole 15 provided in the heater 11 and an air hole 14 provided in the bonding head 10.

As indicated by an arrow 93 in FIG. 4, cooling air that flows into the outer peripheral cooling flow path 28a from the air holes 14 and 15 through the air hole 29 flows along the inner peripheral surface of the recess 23a as indicated by arrows 95 and 96 in FIG. 5, and then flows into the inner peripheral cooling flow path 28b from the side opposite to the air hole 29, passes between the protrusions 27, and flows into a vacuum device VAC from the vacuum holes 30, 13, and 12 as indicated by an arrow 94 in FIG. 4. While cooling air flows through the outer peripheral cooling flow path 28a and the inner peripheral cooling flow path 28b, a pressure is close to a vacuum, and the memory chip 60 is vacuum-suctioned.

Figure 6:
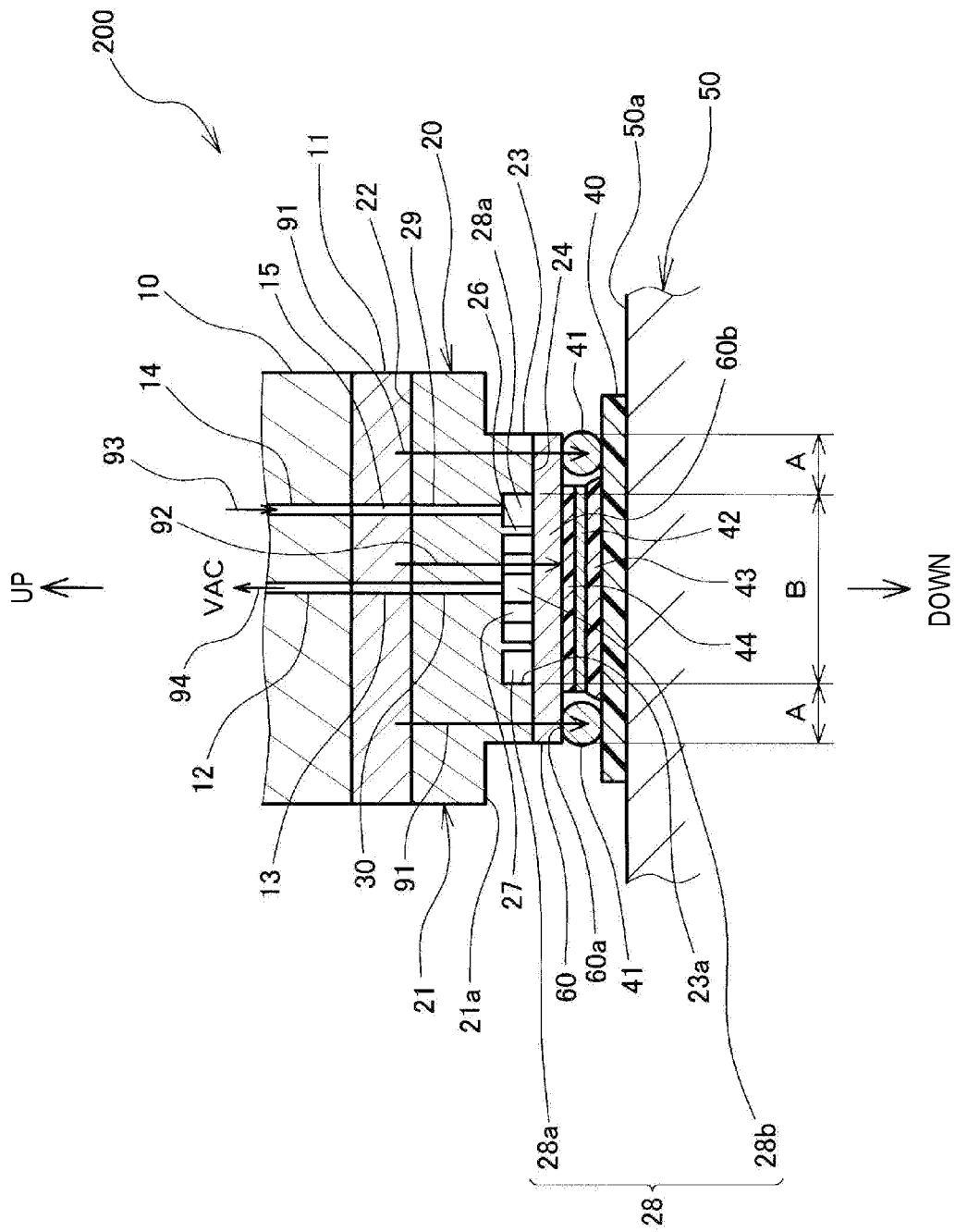
FIG. 6 is an explanatory diagram showing a state in which the bonding apparatus shown in FIG. 4 presses a center of a memory chip heated with a heater to a DAF on a controller chip and presses a peripheral edge of the memory chip onto a solder ball formed on a substrate.

As shown in FIG. 6, like the bonding apparatus 100 of the first embodiment, when a control unit (not shown) of the bonding apparatus 200 lowers the bonding head 10 toward the stage 50 in the state shown in FIG. 4, a lower surface of the center 60b of the memory chip 60 presses the DAF 44 placed on the control chip 42 downward by a downward load that is transmitted through the partition wall 26 and the protrusion 27 of the bonding tool 20. The lower surface of the peripheral edge 60a of the memory chip 60 presses the solder ball 41 downward by a downward load transmitted through the first peripheral area A of the bonding tool 20. In addition, as indicated by the arrow 91 in FIG. 6, heat of the heater 11 heats the peripheral edge 60a of the memory chip 60 through the first peripheral area A of the bonding tool 20 and the peripheral edge 60a of the memory chip 60 heats the solder ball 41. In addition, as indicated by the arrow 92 in FIG. 6, heat of the heater 11 heats the center 60b of the memory chip 60 through the first central area B in which the outer peripheral cooling flow path 28a and the inner peripheral cooling flow path 28b of the bonding tool 20 are formed, and the center 60b of the memory chip 60 heats the DAF 44 placed on the control chip 42.

Since cooling air flows through the outer peripheral cooling flow path 28a and the inner peripheral cooling flow path 28b of the first central area B, heat from the heater 11 does not reach the memory chip 60 through the cooling flow paths 28a and 28b, and as indicated by the arrow 92 in FIG. 6, and reaches the memory chip 60 through a tip surface of the partition wall 26 in contact with the upper surface of the memory chip 60 and a tip surface of the protrusion 27. In contrast, the first peripheral area A of the bonding tool 20 is a plane and is in contact with the upper surface of the memory chip 60. Therefore, as indicated by the arrow 91 in FIG. 3, heat from the heater 11 reaches the memory chip 60 from the entire first peripheral area A of the bonding tool 20.

Here, a contact area between a tip surface of the partition wall 26 and a tip surface of the protrusion 27, and the center 60b of the memory chip 60 is smaller than a contact area between the first peripheral area A of the bonding tool 20 and the peripheral edge 60a of the memory chip 60. In addition, a temperature of the partition wall 26 and the protrusion 27 is lower than a temperature of the first peripheral area A due to cooling air flowing around it. In addition, as described above, hardly any heat of the heater 11 is transmitted through an area in which the cooling flow paths 28a and 28b of the first central area B are formed. Therefore, like the first embodiment, an amount of heat per unit area of the memory chip 60 that is transmitted to the center 60b of the memory chip 60 from the first central area B of the bonding tool 20 is smaller than an amount of heat per unit area of the memory chip 60 that is transmitted from the first peripheral area A of the bonding tool 20 to the peripheral edge 60a of the memory chip 60. Therefore, when the heater 11 uniformly heats an upper surface 22 of the bonding tool 20, a heat input per unit area of the center 60b of the memory chip 60 is smaller than a heat input per unit area of the peripheral edge 60a of the memory chip 60, and a temperature of the center 60b of the memory chip 60 is lower than that of the peripheral edge 60a of the memory chip 60.

Accordingly, like the bonding apparatus 100 of the first embodiment, the bonding apparatus 200 of the second embodiment melts the solder ball 41 and thermally cures the DAF 44 with a lower heat resistance temperature than a melting temperature of the solder ball 41 without deterioration, and can mount the memory chip 60 on the substrate 40 and the control chip 42.

Third Embodiment

Figure 7:
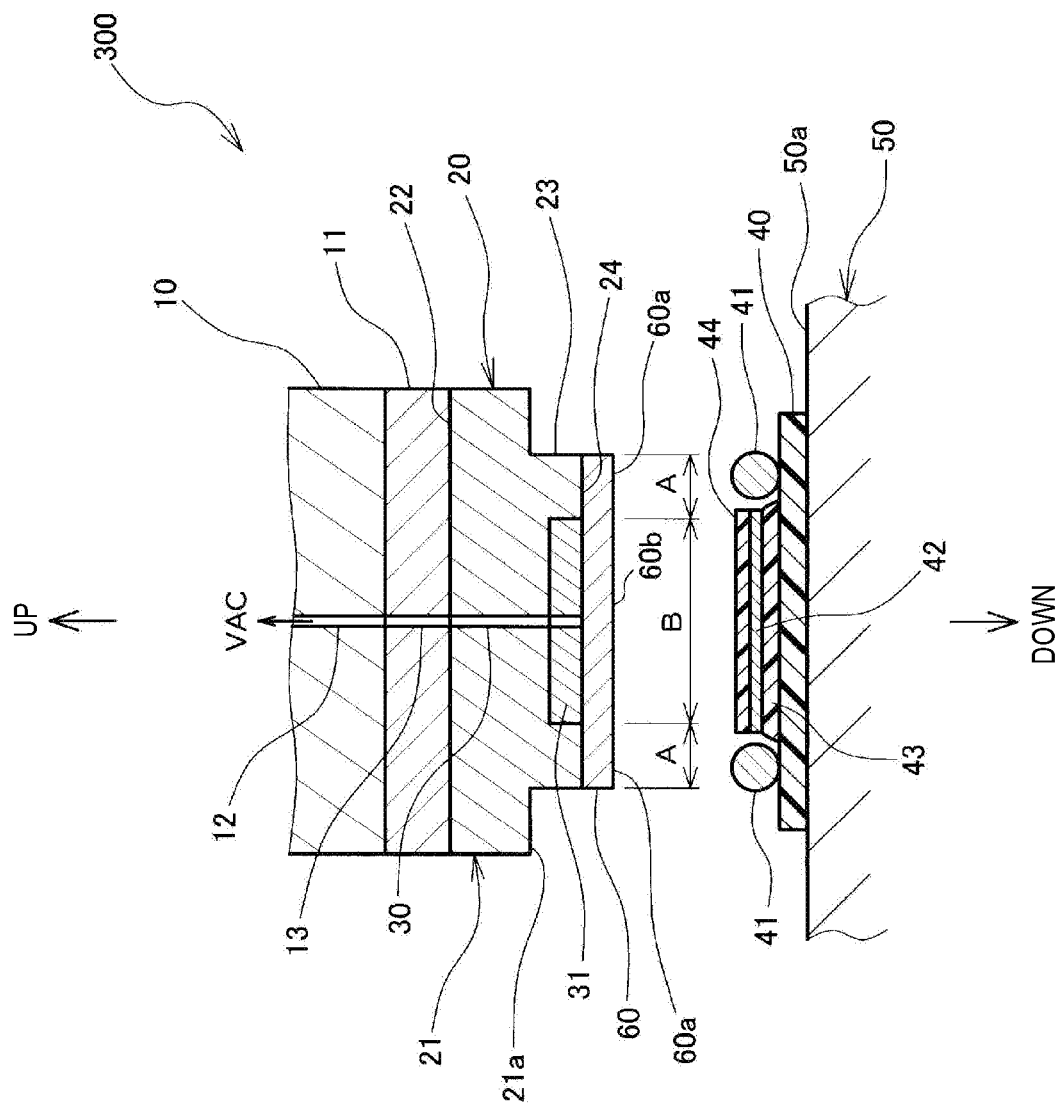
FIG. 7 is a cross-sectional view of a bonding apparatus of a third embodiment of the present invention.

Next, a bonding apparatus 300 of a third embodiment will be described with reference to FIG. 7. As shown in FIG. 7, in the bonding apparatus 300, an insulating material 31 having a lower thermal conductivity than that of the first peripheral area A is attached to the first central area B of the lower surface 24 of the bonding tool 20. Parts the same as those in the bonding apparatus 100 of the first embodiment described above with reference to FIG. 1 to FIG. 3 are denoted with the same reference numerals, and descriptions thereof will be omitted.

In the bonding apparatus 300 of the present embodiment, the insulating material 31 having a lower thermal conductivity than that of the first peripheral area A is attached to the first central area B of the bonding tool 20. Therefore, like the bonding apparatuses 100 and 200 of the first and second embodiments described above, an amount of heat per unit area of the memory chip 60 that is transmitted to the center 60b of the memory chip 60 from the first central area B of the bonding tool 20 is smaller than an amount of heat per unit area of the memory chip 60 that is transmitted from the first peripheral area A of the bonding tool 20 to the peripheral edge 60a of the memory chip 60. Therefore, when the heater 11 uniformly heats an upper surface 22 of the bonding tool 20, a heat input per unit area of the center 60b of the memory chip 60 is smaller than a heat input per unit area of the peripheral edge 60a of the memory chip 60, and a temperature of the center 60b of the memory chip 60 is lower than that of the peripheral edge 60a of the memory chip 60.

Accordingly, like the bonding apparatuses 100 and 200 of the first and second embodiments, the bonding apparatus 300 of the third embodiment melts the solder ball 41 and thermally cures the DAF 44 with a lower heat resistance temperature than a melting temperature of the solder ball 41 without deterioration, and can mount the memory chip 60 on the substrate 40 and the control chip 42.

Fourth Embodiment

Next, a bonding apparatus 400 of a fourth embodiment will be described with reference to FIGS. 8 to 10. In the bonding apparatus 400, a recess 32 is provided on the upper surface 22 which is a second surface of the bonding tool 20 of the bonding apparatus 100 of the first embodiment. Like the bonding apparatus 100 of the first embodiment, on the lower surface 24, the plurality of recesses 25 are disposed in a lattice form. Parts the same as those in the bonding apparatus 100 of the first embodiment described above with reference to FIG. 1 to FIG. 3 are denoted with the same reference numerals, and descriptions thereof will be omitted.

Figure 8:
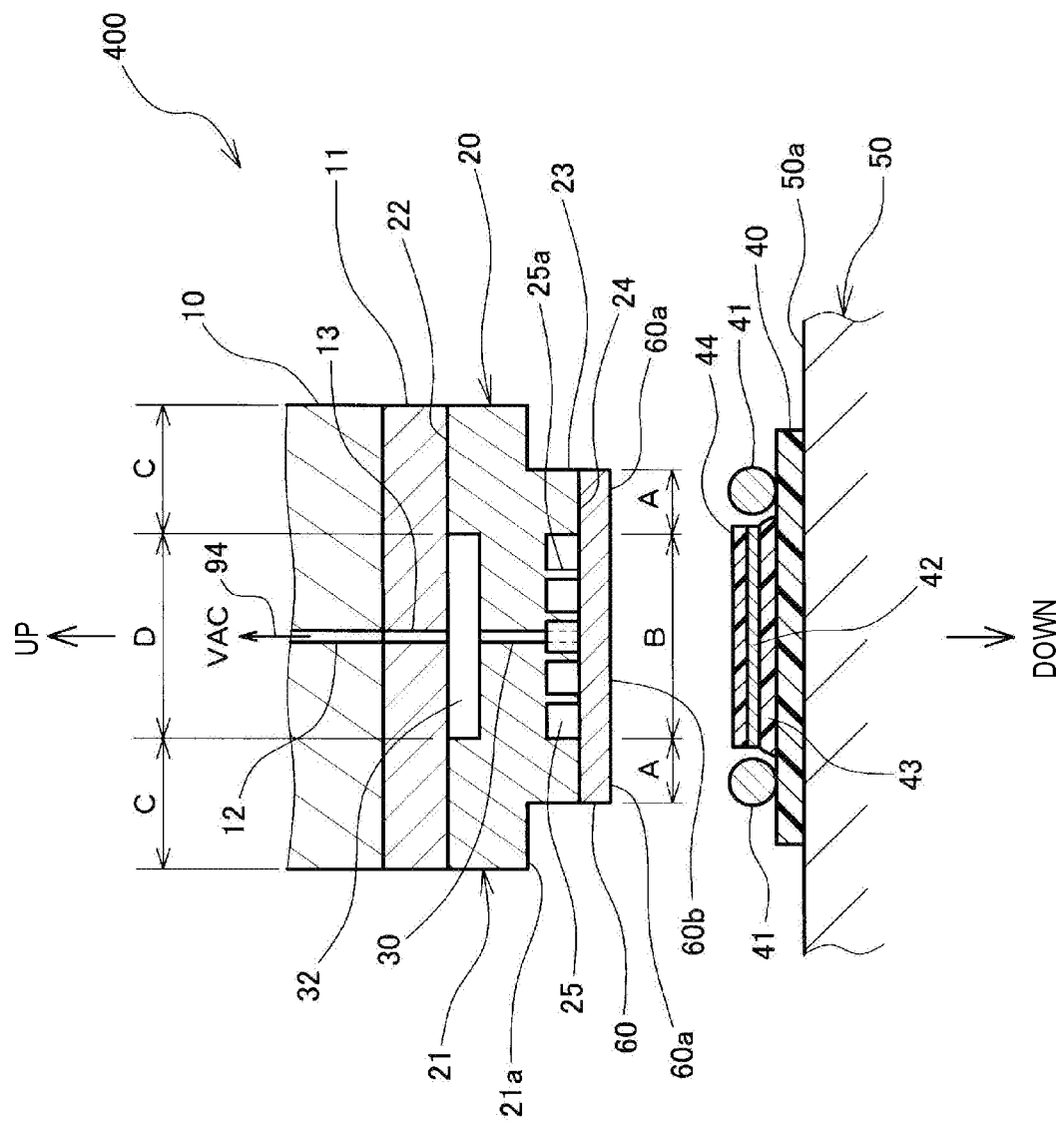
FIG. 8 is a cross-sectional view of a bonding apparatus of a fourth embodiment of the present invention.
Figure 9:
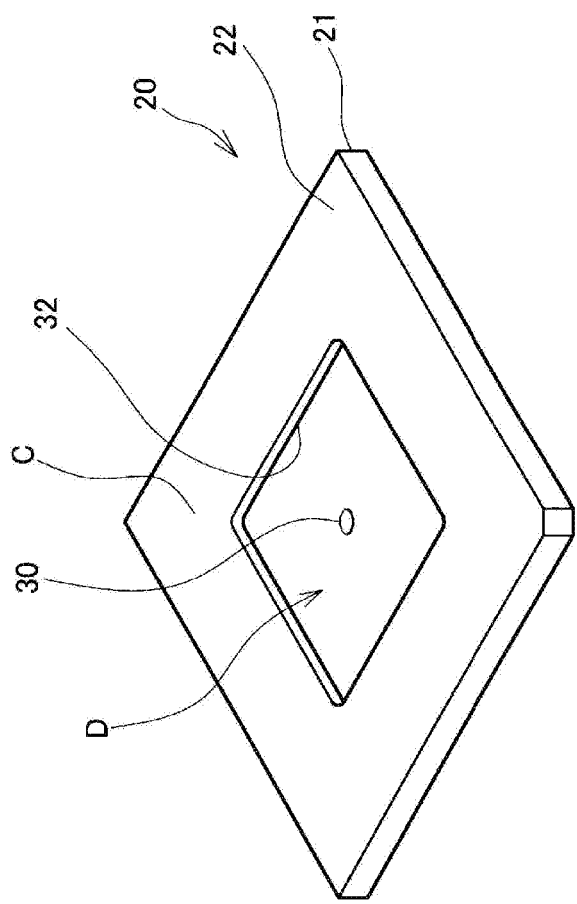
FIG. 9 is a perspective view of a bonding tool attached to the bonding apparatus shown in FIG. 8 when viewed from the upper side.

As shown in FIGS. 8 and 9, the recess 32 of the upper surface 22 which is a second surface is provided in an area corresponding to the first central area B of the lower surface 24 and defines a second central area D. The upper surface 22 outside the periphery of the recess 32 is a second peripheral area C. At the center of the recess 32, the vacuum hole 30 that communicates with the lower surface 24 is provided. In addition, as shown in FIG. 8, the vacuum hole 13 provided in the heater 11 communicates with the recess 32. When the vacuum hole 12 of the bonding head 10 that communicates with the vacuum hole 13 of the heater 11 is vacuumed by a vacuum device VAC (not shown), the recess 32 of the upper surface 22 of the bonding tool 20 and the plurality of recesses 25 of the lower surface 24 become a vacuum, and respective vacuum heat insulating layers are formed.

Figure 10:
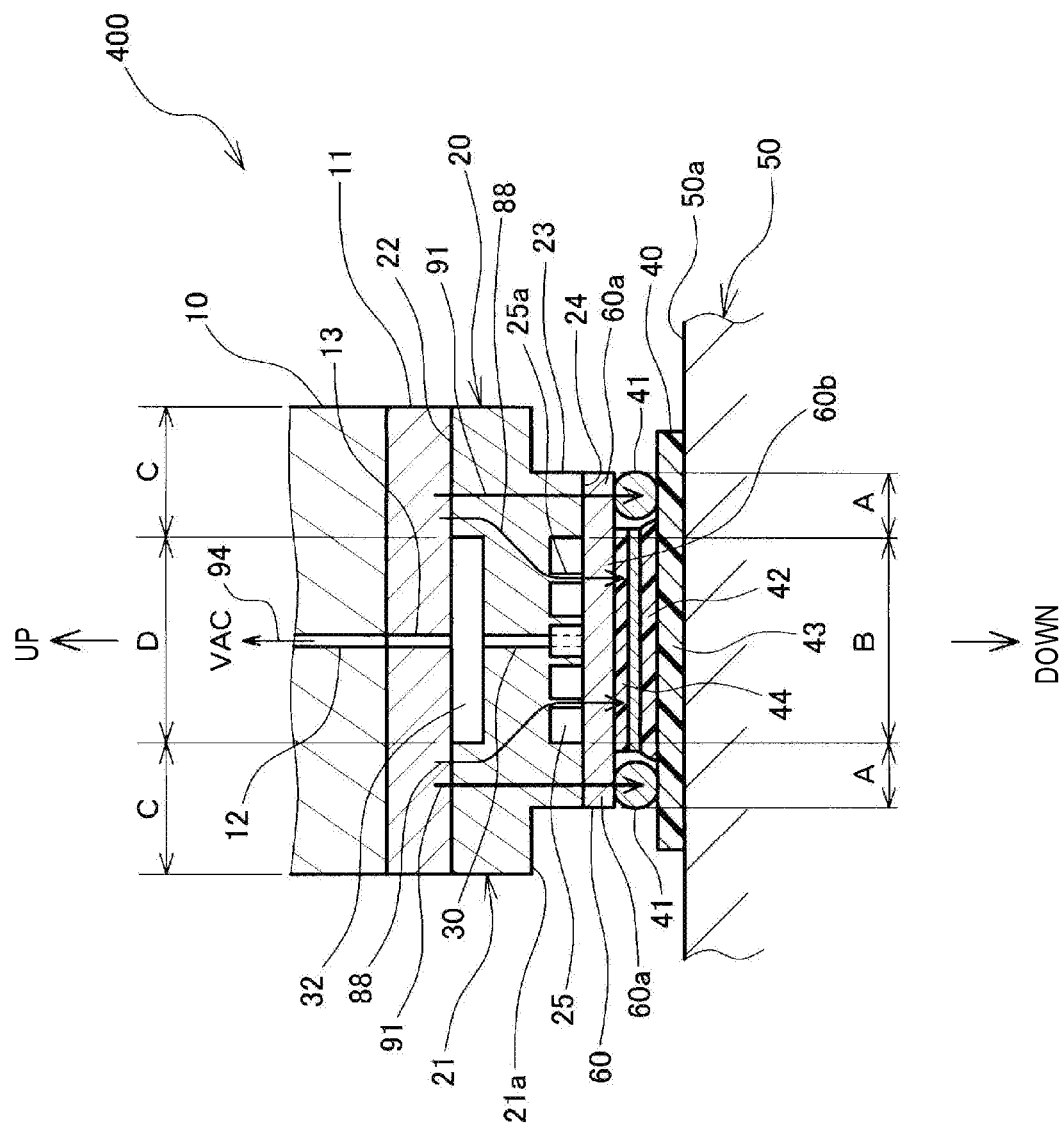
FIG. 10 is an explanatory diagram showing a state in which the bonding apparatus shown in FIG. 8 presses a center of a memory chip heated with a heater to a DAF on a controller chip and presses a peripheral edge of the memory chip onto a solder ball formed on a substrate.

As shown in FIG. 10, when a control unit (not shown) of the bonding apparatus 400 lowers the bonding head 10 toward the stage 50 in the state shown in FIG. 8, a lower surface of the center 60b of the memory chip 60 presses the DAF 44 placed on the control chip 42 downward by a downward load that is transmitted through the rib 25a of the bonding tool 20. The lower surface of the peripheral edge 60a of the memory chip 60 presses the solder ball 41 downward by a downward load that is transmitted through the first peripheral area A of the bonding tool 20. In addition, when the heater 11 is turned on, as indicated by the arrow 91, heat of the heater 11 heats the peripheral edge 60a of the memory chip 60 through the entire first peripheral area A from the second peripheral area C of the bonding tool 20, and the peripheral edge 60a of the memory chip 60 heats the solder ball 41. In addition, as indicated by an arrow 88, heat of the heater 11 does not pass through the recess 32 serving as a heat insulating layer, and heats the center 60b of the memory chip 60 through a tip surface of the rib 25a of the first central area B from the second peripheral area C of the bonding tool 20, and the center 60b of the memory chip 60 heats the DAF 44 placed on the control chip 42.

Here, a contact area between the tip surface of the rib 25a of the bonding tool 20 and the center 60b of the memory chip 60 is smaller than a contact area between the first peripheral area A of the bonding tool 20 and the peripheral edge 60a of the memory chip 60. In addition, heat flowing into the rib 25a is heat that flows from the second peripheral area C of the bonding tool 20, and an amount of the heat is smaller than an amount of heat that flows from the second peripheral area C to the first peripheral area A. In addition, as described above, the heat insulating layer formed with the recess 25 hardly transmits heat of the heater 11. Therefore, like the case of the first embodiment described above, an amount of heat per unit area of the memory chip 60 that is transmitted from the first central area B of the bonding tool 20 to the center 60b of the memory chip 60 is further reduced, and a heat input per unit area of the center 60b of the memory chip 60 is also reduced. Therefore, a temperature of the center 60b of the memory chip 60 is further reduced.

Accordingly, the DAF 44 having a lower heat resistance temperature than the bonding apparatus 100 of the first embodiment is used to melt the solder ball 41 and thermally cure the DAF 44 with a lower heat resistance temperature than a melting temperature of the solder ball 41 without deterioration, and thus the memory chip 60 can be mounted on the substrate 40 and the control chip 42.

Fifth Embodiment

Figure 11:
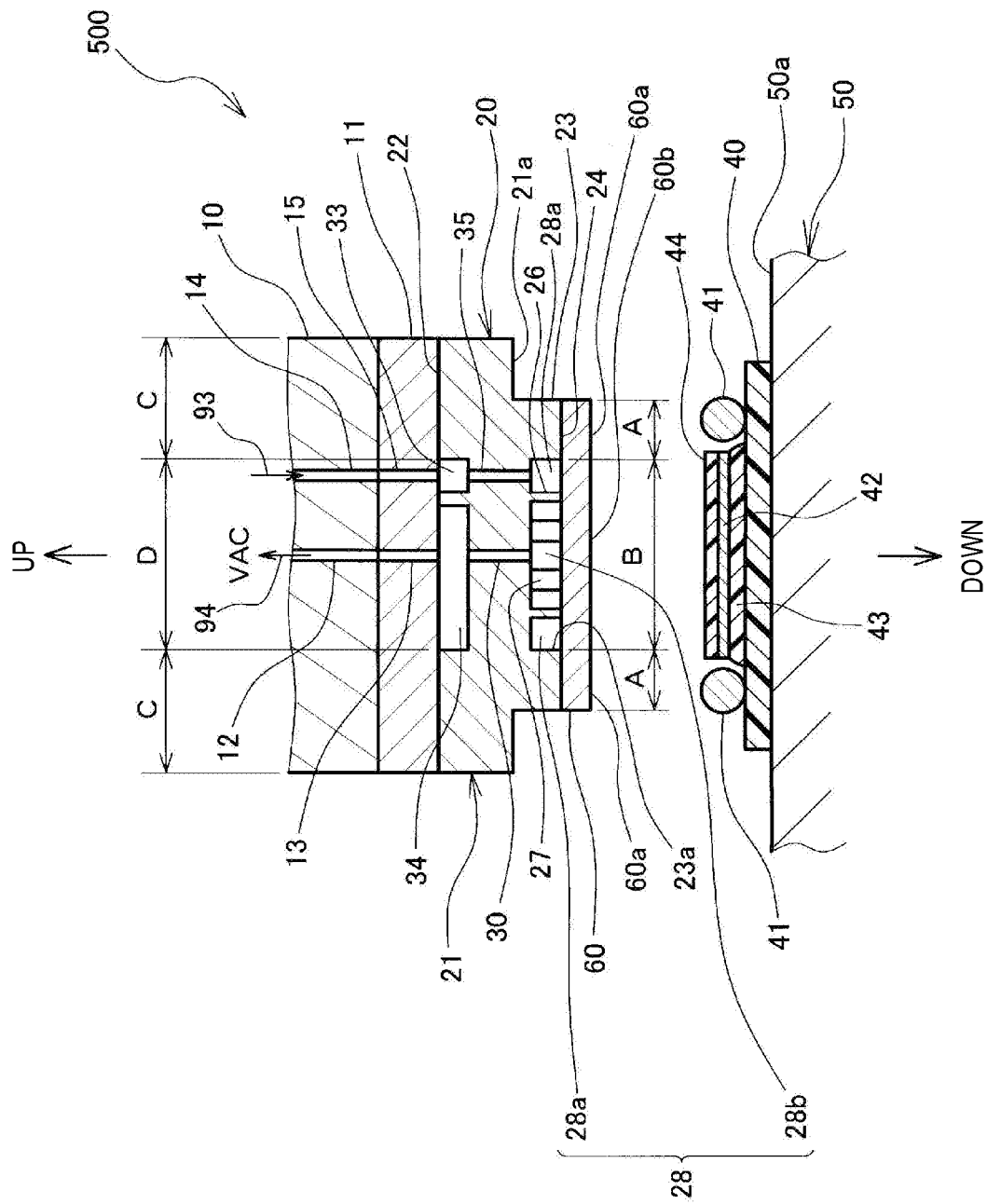
FIG. 11 is a cross-sectional view of a bonding apparatus of a fifth embodiment of the present invention.

Next, a bonding apparatus 500 of a fifth embodiment will be described with reference to FIGS. 11 to 13. As shown in FIG. 11, in the bonding apparatus 500 of the fifth embodiment, the cooling flow path 28 described with reference to FIGS. 4 to 6 is provided on the lower surface 24 of the bonding tool 20 of the bonding apparatus 400 of the fourth embodiment described above, and on the upper surface 22, a recess 33 partitioned from a recess 34 and an air hole 35 that communicates with the recess 33 and the cooling flow path 28 are provided. Parts the same as those in the bonding apparatus 200 of the second embodiment described with reference to FIGS. 4 to 6 and the bonding apparatus 400 of the fourth embodiment described with reference to FIGS. 8 to 10 are denoted with the same reference numerals, and descriptions thereof will be omitted.

Figure 12:
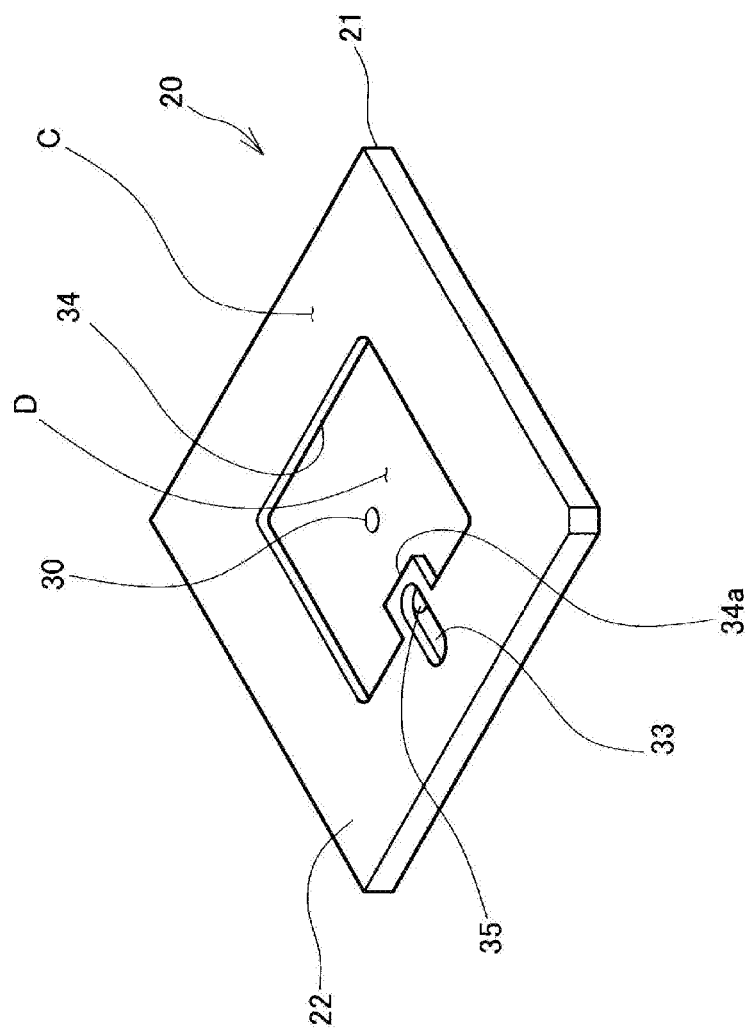
FIG. 12 is a perspective view of a bonding tool attached to the bonding apparatus shown in FIG. 11 when viewed from the upper side.

As shown in FIGS. 11 and 12, the recess 34 of the upper surface 22 which is a second surface is provided in an area corresponding to the first central area B of the lower surface 24 and defines the second central area D. The upper surface 22 outside the periphery of the recess 34 is the second peripheral area C. At the center of the recess 34, the vacuum hole 30 that communicates with the inner peripheral cooling flow path 28b of the lower surface is provided. In addition, as shown in FIG. 11, the vacuum hole 13 provided in the heater 11 communicates with the recess 34.

As shown in FIG. 12, on one side of the recess 34, a pedestal 34a that protrudes toward the inner peripheral side of the recess 34 and having the recess 33 provided therein is formed. The surface of the pedestal 34a is flush with the upper surface 22. The recess 33 and the recess 34 are portioned with a wall of the pedestal 34a so that air does not communicate threrewith. In the recess 33, the air hole 35 that communicates with the outer peripheral cooling flow path 28a is provided. In addition, as shown in FIG. 11, the air hole 15 of the heater 11 communicates with the recess 33. Here, the second peripheral area C includes the pedestal 34a.

As indicated by the arrow 93 in FIG. 11, cooling air flowing into the air hole 15 of the heater 11 from the air hole 14 of the bonding head 10 flows into the recess 33 of the upper surface 22 of the bonding tool 20 and flows into the outer peripheral cooling flow path 28a from the recess 33 through the air hole 35. As described above with reference to FIG. 5, cooling air flowing into the outer peripheral cooling flow path 28a flows along the inner peripheral surface of the recess 23a as indicated by arrows 95 and 96 in FIG. 5, and then flows into the inner peripheral cooling flow path 28b, passes between the protrusions 27 and flows into the recess 34 of the upper surface 22 from the vacuum hole 30. Then, air flowing into the recess 34 flows into a vacuum device VAC through the heater 11, and the vacuum holes 13 and 12 of the bonding head 10 as indicated by the arrow 94 in FIG. 11. Although cooling air flows through the outer peripheral cooling flow path 28a, the inner peripheral cooling flow path 28b, and the recess 34, a pressure is close to a vacuum. Therefore, the bonding tool 20 is vacuum-suctioned to the heater 11 by a vacuum of the recess 34 and a vacuum of the cooling flow path 28 vacuum-suctions the memory chip 60.

Figure 13:
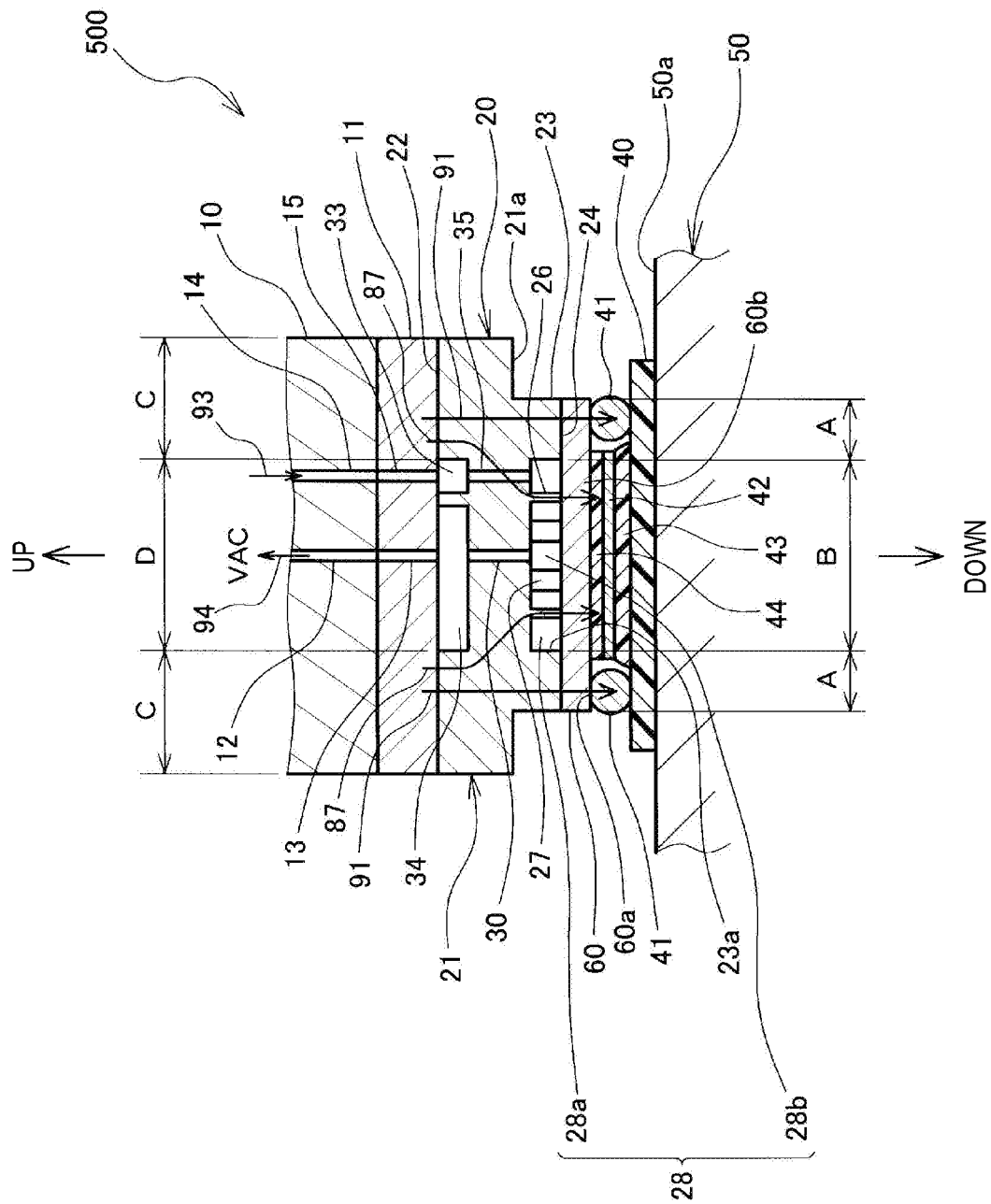
FIG. 13 is an explanatory diagram showing a state in which the bonding apparatus shown in FIG. 11 presses a center of a memory chip heated with a heater to a DAF on a controller chip and presses a peripheral edge of the memory chip onto a solder ball formed on a substrate.

As shown in FIG. 13, when a control unit (not shown) of the bonding apparatus 500 lowers the bonding head 10 toward the stage 50 in the state shown in FIG. 11, a lower surface of the center 60b of the memory chip 60 presses the DAF 44 placed on the control chip 42 downward by a downward load that is transmitted through the partition wall 26 and the protrusion 27 of the bonding tool 20. The lower surface of the peripheral edge 60a of the memory chip 60 presses the solder ball 41 downward by a downward load that is transmitted through the first peripheral area A of the bonding tool 20. In addition, when the heater 11 is turned on, as indicated by the arrow 91, heat of the heater 11 heats the peripheral edge 60a of the memory chip 60 through the entire first peripheral area A from the second peripheral area C of the bonding tool 20, and the peripheral edge 60a of the memory chip 60 heats the solder ball 41. In addition, as indicated by an arrow 87, heat of the heater 11 does not pass through the recess 34 in which cooling air flows, heats the center 60b of the memory chip 60 through a tip surface of the partition wall 26 of the first central area B and a tip surface of the protrusion 27 from the second peripheral area C of the bonding tool 20, and the center 60b of the memory chip 60 heats the DAF 44 placed on the control chip 42.

In the bonding tool 20 of the bonding apparatus 500 of the fifth embodiment, since cooling air flows through both the recess 34 of the second central area D of the upper surface 22 and the cooling flow path 28 of the first central area B of the lower surface 24, a heat input per unit area of the center 60b of the memory chip 60 is smaller than that of the bonding apparatus 400 of the fourth embodiment described above, and a temperature of the center 60b of the memory chip 60 is further reduced.

Accordingly, using the DAF 44 with a lower heat resistance temperature than that of the bonding apparatus 400 of the fourth embodiment described above, the bonding apparatus 500 melts the solder ball 41 and thermally cures the DAF 44 with a lower heat resistance temperature than a melting temperature of the solder ball 41 without deterioration, and can mount the memory chip 60 on the substrate 40 and the control chip 42.

Sixth Embodiment

Figure 14:
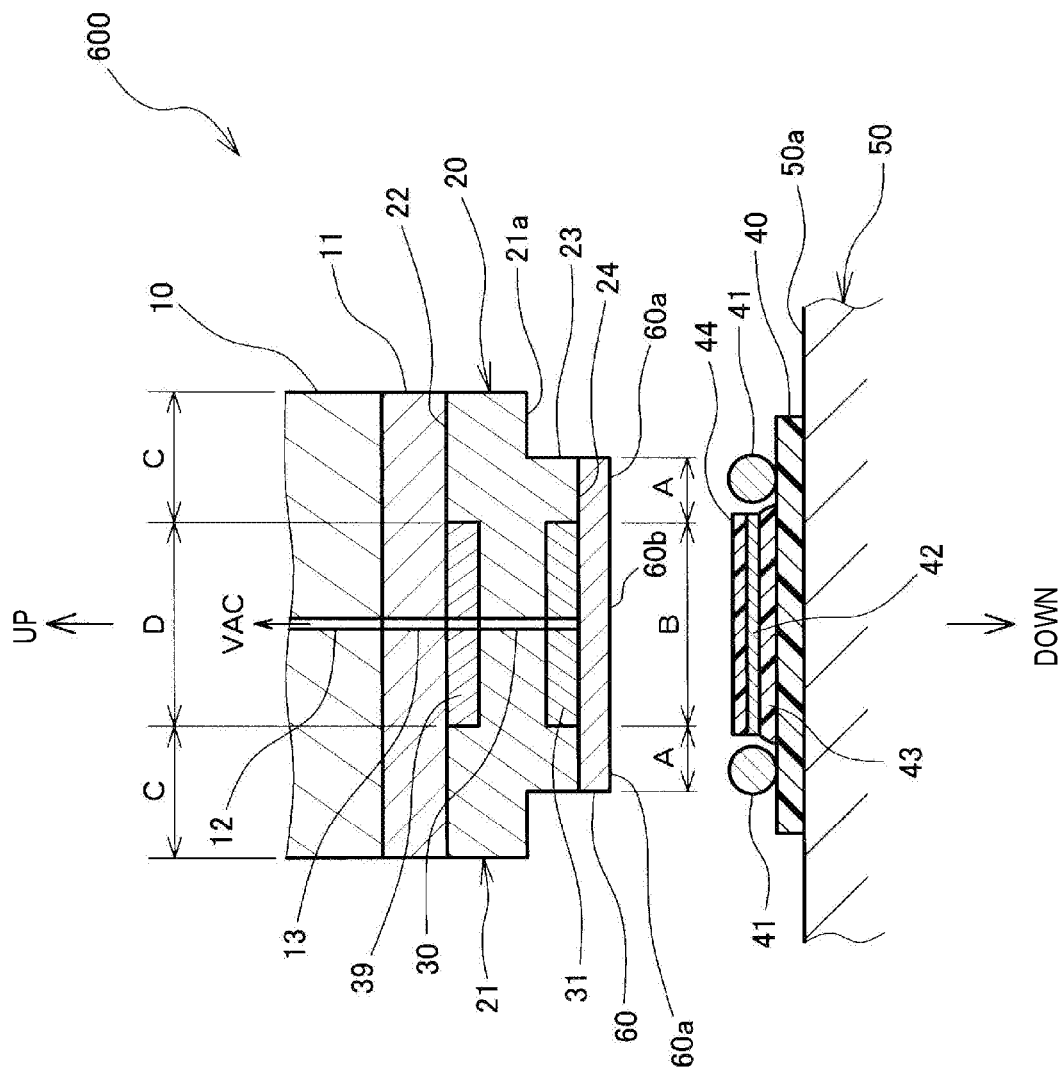
FIG. 14 is a cross-sectional view of a bonding apparatus of a sixth embodiment of the present invention.

Next, a bonding apparatus 600 of a sixth embodiment will be described with reference to FIG. 14. In the bonding apparatus 600, the insulating materials 31 and 39 having a lower thermal conductivity than those of the first peripheral area A and the second peripheral area C are attached to the first central area B of the lower surface 24 of the bonding tool 20 and the second central area D of the upper surface thereof. Parts the same those in the bonding apparatus 300 of the third embodiment described above with reference to FIG. 7 are denoted with the same reference numerals, and descriptions thereof will be omitted.

In the bonding apparatus 600 of the present embodiment, the insulating materials 31 and 39 having a lower thermal conductivity than those of the first peripheral area A and the second peripheral area C are attached to the first central area B and the second central area D of the bonding tool 20. Therefore, compared to the bonding apparatus 300 of the third embodiment described above, an amount of heat per unit area of the memory chip 60 that is transmitted from the first central area B of the bonding tool 20 to the center 60b of the memory chip 60 is smaller, a heat input per unit area of the center 60b of the memory chip 60 is smaller, and a temperature of the center 60b of the memory chip 60 is lower than that of the bonding apparatus 300.

Accordingly, using the DAF 44 with a lower heat resistance temperature than that of the bonding apparatus 300 of the third embodiment described above, the bonding apparatus 600 melts the solder ball 41 and thermally cures the DAF 44 with a lower heat resistance temperature than a melting temperature of the solder ball 41 without deterioration, and can mount the memory chip 60 on the substrate 40 and the control chip 42.

Seventh Embodiment

Next, a bonding apparatus 700 of a seventh embodiment will be described with reference to FIG. 15. In the bonding apparatus 700, a cooling flow path 58 is provided in the stage 50 of the bonding apparatus 100 of the first embodiment. Parts the same as those in the bonding apparatus 100 described above with reference to FIGS. 1 to 3 are denoted with the same reference numerals, and descriptions thereof will be omitted.

Figure 15:
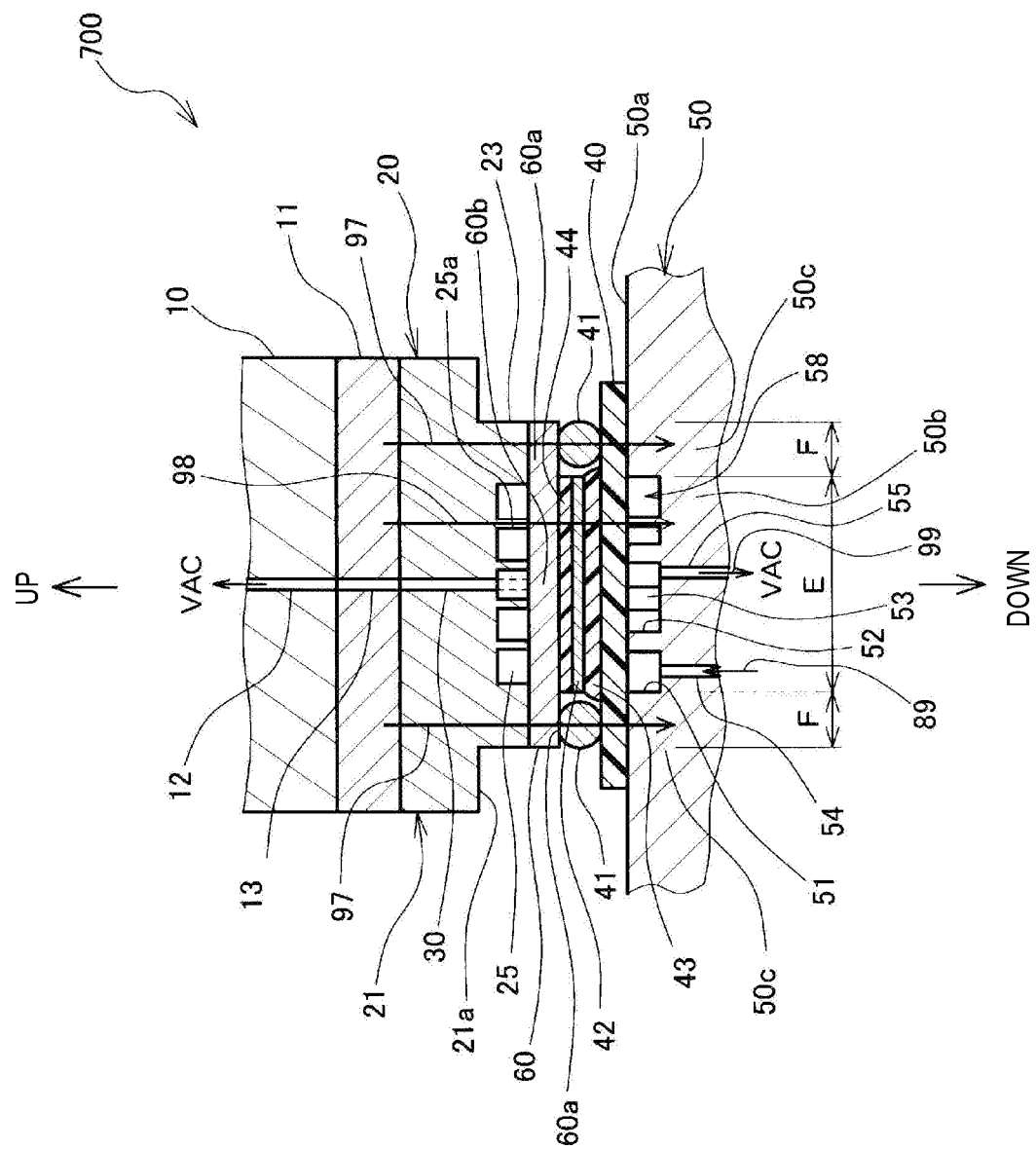
FIG. 15 is a cross-sectional view of a bonding apparatus of a seventh embodiment of the present invention.

As shown in FIG. 15, in the bonding apparatus 700, a recess 51 is provided in a first portion 50b of the stage 50 that faces a first area E of the substrate 40 to which the control chip 42 is bonded, and as described with reference to FIG. 5, a substantially U-shaped partition wall 52 is provided therein, a protrusion 53 is provided on the inner peripheral side of the partition wall 52, and the cooling flow path 58 the same as described with reference to FIG. 5 is formed. At one end of the recess 51, an air hole 54 through which cooling air flows into the cooling flow path 58 is provided, and at the center of the recess 51, a vacuum hole 55 through which cooling air communicates with a vacuum device VAC is provided. As indicated by an arrow 89 in FIG. 15, air flowing from the air hole 54 into the cooling flow path 58 flows through the cooling flow path 58 and is then discharged from the vacuum hole 55, as indicated by an arrow 99 in FIG. 15. Cooling air flows in the cooling flow path 58, but its pressure is substantially a vacuum and vacuum-suctions the substrate 40.

The outside of the area in which the control chip 42 of the substrate 40 is mounted is a second area F of the substrate 40, and the second area F of the substrate 40 is in contact with the surface 50a of the stage 50. In the second area F of the substrate 40, the solder ball 41 is formed. An area of the stage 50 that faces the second area F of the substrate 40 is a second portion 50c of the stage 50.

As shown in FIG. 15, when a control unit (not shown) of the bonding apparatus 700 lowers the bonding head 10 toward the stage 50, as indicated by an arrow 97 in FIG. 15, heat of the heater 11 heats the peripheral edge 60a of the memory chip 60 through the first peripheral area A of the bonding tool 20, and the peripheral edge 60a of the memory chip 60 heats the solder ball 41. Heat of the solder ball 41 flows from the second area F of the substrate 40 to the second portion 50c of the stage 50. In addition, as indicated by an arrow 98 in FIG. 15, heat of the heater 11 heats the center 60b of the memory chip 60 through the first central area B of the bonding tool 20 and the center 60b of the memory chip 60 heats the DAF 44 placed on the control chip 42. Then, heat that has heated the DAF 44 flows to the first portion 50b of the stage 50 through the control chip 42 and the resin 43.

Since cooling air flows through the cooling flow path 58 of the stage 50, heat easily flows from the first area E of the substrate 40 to the first portion 50b of the stage 50. In contrast, the second area F of the substrate 40 in which the solder ball 41 is formed is in contact with the surface 50a of the stage 50. However, since the cooling flow path 58 is not formed, an amount of heat flowing from the substrate 40 to the second portion 50c of the stage 50 is smaller than that of the first area E. That is, amount of heat per unit area of the substrate 40 that is transmitted from the first area E of the substrate 40 to the first portion 50b of the stage 50 is larger than an amount of heat per unit area of the substrate 40 that is transmitted from a second area of the substrate 40 to a second portion of the stage 50. Therefore, a temperature of the first area E at the center of the substrate 40 is lower than a temperature around the second area F of the substrate 40. Therefore, a temperature of the DAF 44 placed on the control chip 42 mounted on the first area E of the substrate 40 is lower than a temperature of the solder ball 41 formed on the second area F of the substrate 40.

Therefore, in the bonding apparatus 700, a temperature of the DAF 44 is lower than that of the bonding apparatus 100 of the first embodiment described above, the DAF 44 with a lower heat resistance temperature than the bonding apparatus 100 is used to melt the solder ball 41 and thermally cure the DAF 44 with a lower heat resistance temperature than a melting temperature of the solder ball 41 without deterioration, and thus the memory chip 60 can be mounted on the substrate 40 and the control chip 42.

Here, in the bonding apparatus 700, when a material having low thermal conductivity is used as a material of the stage 50, an amount of heat escaping from the second area F of the substrate 40 to the second portion 50c of the stage 50 is smaller, and a temperature of the solder ball 41 can be kept high. Therefore, when the stage 50 is made of a ceramic material, a strong effect is obtained.

Eighth Embodiment

Figure 16:
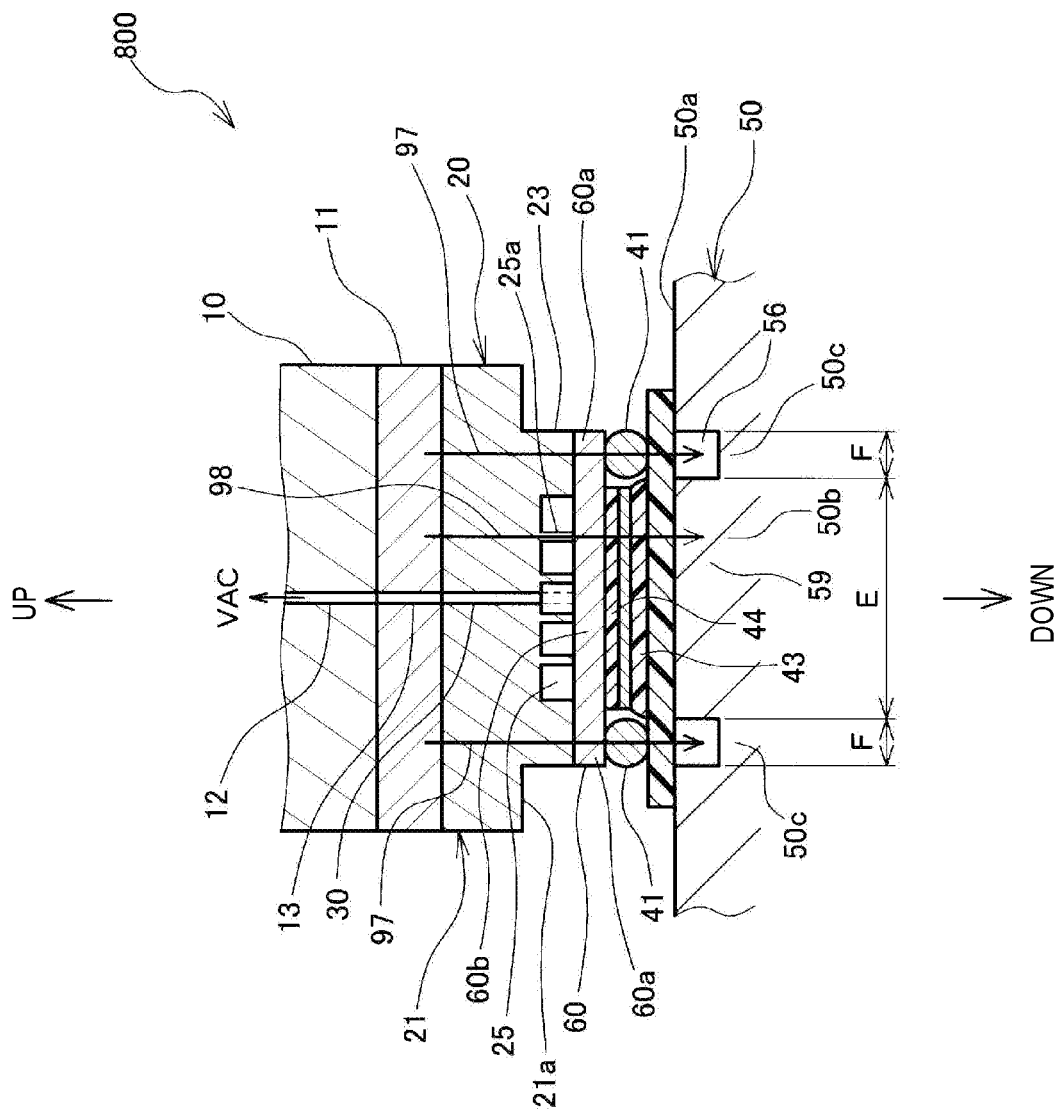
FIG. 16 is a cross-sectional view of a bonding apparatus of an eighth embodiment of the present invention.

Next, a bonding apparatus 800 of an eighth embodiment will be described with reference to FIG. 16. In the bonding apparatus 800, the first portion 50b of the stage 50 has a planar structure, and a recess 56 is provided in the second portion 50c. In the following description, parts the same as those in the bonding apparatus 100 described above with reference to FIGS. 1 to 3 and parts the same as those in the bonding apparatus 700 described above with reference to FIG. 15 are denoted with the same reference numerals, and descriptions thereof will be omitted. Unlike the bonding apparatus 700 described above, the stage 50 of the bonding apparatus 800 is made of a material having high thermal conductivity, for example, copper or iron.

Since the recess 56 provided in the second portion 50c of the stage 50 constitutes a heat insulating layer for air, it blocks a flow of heat from the second area F of the substrate 40 to the second portion 50c of the stage 50. In contrast, since the stage 50 is made of a material having high thermal conductivity such as copper or iron, a thermal resistance from the first area E of the substrate 40 to the first portion 50b of the stage 50 is lower than a thermal resistance from the second area F of the substrate 40 to the second portion 50c of the stage 50. Therefore, an amount of heat per unit area of the substrate 40 that is transmitted from the first area E of the substrate 40 to the first portion 50b of the stage 50 is larger than an amount of heat per unit area of the substrate 40 that is transmitted from a second area of the substrate 40 to the second portion 50c of the stage 50, and a temperature of the first area E at the center of the substrate 40 is lower than a temperature around the second area F of the substrate 40. Therefore, like the bonding apparatus 700 described above, a temperature of the DAF 44 placed on the control chip 42 mounted on the first area E of the substrate 40 is lower than a temperature of the solder ball 41 formed in the second area F of the substrate 40.

Therefore, like the bonding apparatus 700, in the bonding apparatus 800, a temperature of the DAF 44 is lower than that of the bonding apparatus 100 of the first embodiment described above, the DAF 44 with a lower heat resistance temperature than the bonding apparatus 100 is used to melt the solder ball 41 and thermally cure the DAF 44 with a lower heat resistance temperature than a melting temperature of the solder ball 41 without deterioration, and thus the memory chip 60 can be mounted on the substrate 40 and the control chip 42.

Figure 17:
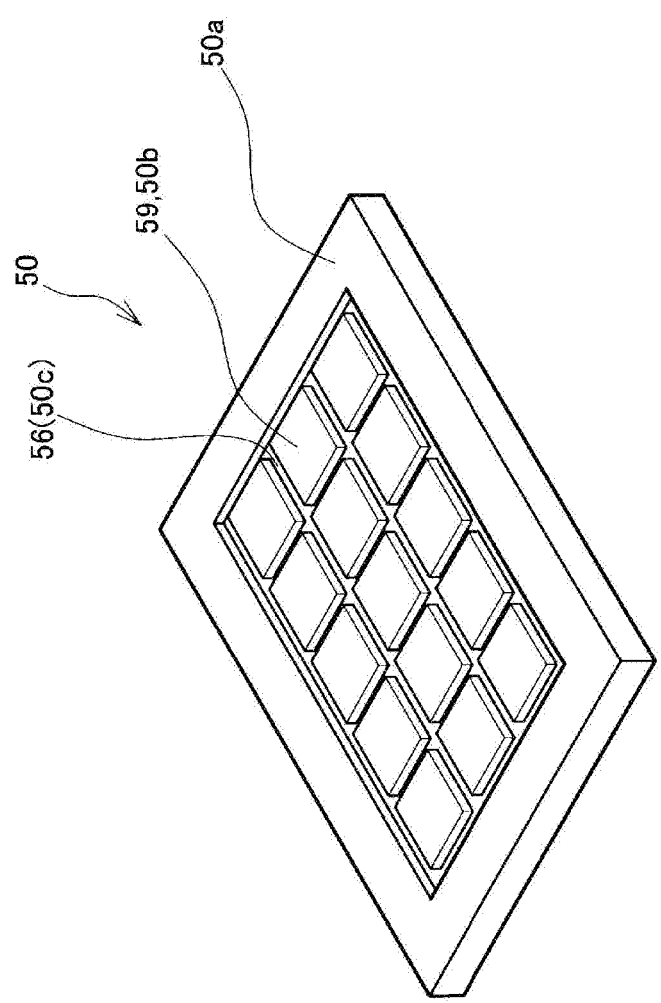
FIG. 17 is a perspective view showing a stage of the bonding apparatus shown in FIG. 16.

While various structures are conceivable as a structure for forming the recess 56 on the surface 50a of the stage 50, when a plurality of control chips 42 are mounted on the substrate 40, as shown in FIG. 17, a portion in which the control chip 42 is positioned when the substrate 40 is absorbed and fixed to the surface of the stage 50, that is, a portion corresponding to the first portion 50b, is set as a pedestal 59 with a flat surface, and the recess 56 may be provided in a portion corresponding to the second portion 50c that is positioned around the pedestal 59.

Here, the present invention is not limited to the embodiments described above, but it includes all alternations and modifications without departing from the technical scope of the present invention defined in the claims.

REFERENCE SIGNS LIST

10 Bonding head
11 Heater
12, 13, 30, 55 Vacuum hole
14, 15, 29, 35, 54 Air hole
20 Bonding tool
21 Base
21a, 50a Surface
22 Upper surface
23 Island
23a, 25, 32, 33, 34, 51, 56 Recess
24 Lower surface
25a Rib
26, 52 Partition wall
27, 53 Protrusion
28, 58 Cooling flow path
28a Outer peripheral cooling flow path
28b Inner peripheral cooling flow path
31, 39 Insulating material
34a, 59 Pedestal
40 Substrate
41 Solder ball
42 Control chip
43 Resin
44 DAF
50 Stage
50b First portion
50c Second portion
60 Memory chip
60a Peripheral edge
60b Center
100, 200, 300, 400, 500, 600, 700, 800 Bonding apparatus
A First peripheral area
B First central area
C Second peripheral area
D Second central area
E First area
F Second area

The invention claimed is:

1. A bonding apparatus comprising:
a heater; and
a bonding tool,
wherein the bonding tool includes a first surface that absorbs a bonding member and a second surface that is attached to the heater on the side opposite to the first surface, the first surface includes a first peripheral area and a first central area, a recess is formed in the first central area, the first peripheral area of the first surface presses a peripheral edge of the bonding member to a first member, and the first central area of the first surface presses a center of the bonding member to directly contact and press a second member having a lower heat resistance temperature than the first member,
wherein the bonding tool further includes a vacuum hole that communicates with the recess from the second surface to absorb the bonding member and forms a vacuum heat insulating layer between the recess and the bonding member,
wherein an amount of heat per unit area of the bonding member that is transmitted from the first central area of the bonding tool to the center of the bonding member is smaller than an amount of heat per unit area of the bonding member that is transmitted from the first peripheral area of the bonding tool to the peripheral edge of the bonding member, and
wherein the first central area of the bonding tool has a pressing region configured to contact and press the bonding member, and a cooling flow path through which cooling air flows.

2. The bonding apparatus according to claim 1,
wherein the first central area of the bonding tool has a smaller area in contact with the bonding member than the first peripheral area of the bonding tool.

3. The bonding apparatus according to claim 1,
wherein the first central area of the bonding tool is made of a material having a lower thermal conductivity than that of the first peripheral area of the bonding tool.

4. The bonding apparatus according to claim 1, comprising
a stage that absorbs and fixes a substrate,
wherein the second member is placed on an electronic component bonded to the substrate,
wherein the first member is formed on the substrate around the electronic component, and
wherein an amount of heat per unit area of the substrate that is transmitted to a first portion of the stage that faces a first area of the substrate from the first area of the substrate to which the electronic component is bonded is larger than an amount of heat per unit area of the substrate that is transmitted to a second portion of the stage that faces a second area of the substrate from the second area of the substrate in which the first member is disposed.

5. The bonding apparatus according to claim 4,
wherein, in the stage, a cooling flow path through which cooling air flows is provided in the first portion.

6. The bonding apparatus according to claim 4,
wherein, in the stage, a recess is provided on a surface of the second portion.

7. The bonding apparatus according to claim 1,
wherein the second surface of the bonding tool includes a second central area corresponding to the first central area and a second peripheral area outside the periphery of the second central area, and
wherein an amount of heat per unit area of the heater that is transmitted from the center of the heater to the second central area of the bonding tool is smaller than an amount of heat per unit area of the heater that is transmitted from a peripheral edge of the heater to the second peripheral area of the bonding tool.

8. The bonding apparatus according to claim 7,
wherein the second central area of the bonding tool includes a cooling flow path through which cooling air flows.

9. The bonding apparatus according to claim 7,
wherein the second central area of the bonding tool is made of a material having a lower thermal conductivity than that of the second peripheral area of the bonding tool.

10. The bonding apparatus according to claim 7,
wherein the second central area of the bonding tool has a smaller area in contact with the heater than the second peripheral area of the bonding tool.

11. The bonding apparatus according to claim 10,
wherein a plurality of recesses are disposed in a lattice form on the second central area of the bonding tool.

12. The bonding apparatus according to claim 10,
  wherein the second central area of the bonding tool includes a cooling flow path through which cooling air flows.

13. The bonding apparatus according to claim 7, comprising
  a stage that absorbs and fixes a substrate,
  wherein the second member is placed on an electronic component bonded to the substrate,
  wherein the first member is formed on the substrate around the electronic component, and
  wherein an amount of heat per unit area of the substrate that is transmitted to a first portion of the stage that faces a first area of the substrate from the first area of the substrate to which the electronic component is bonded is larger than an amount of heat per unit area of the substrate that is transmitted to a second portion of the stage that faces a second area of the substrate from the second area of the substrate in which the first member is disposed.

14. The bonding apparatus according to claim 13,
  wherein, in the stage, a cooling flow path through which cooling air flows is provided in the first portion.

15. The bonding apparatus according to claim 13,
  wherein, in the stage, a recess is provided on a surface of the second portion.

* * * * *